US012091309B2

(12) United States Patent
Fujishima et al.

(10) Patent No.: US 12,091,309 B2
(45) Date of Patent: Sep. 17, 2024

(54) MOVABLE DEVICE, DISTANCE MEASUREMENT DEVICE, IMAGE PROJECTION APPARATUS, VEHICLE, AND MOUNT

(71) Applicant: Ricoh Company, Ltd., Tokyo (JP)

(72) Inventors: Masayuki Fujishima, Kanagawa (JP); Junichi Konishi, Hyogo (JP); Tsuyoshi Ueno, Kanagawa (JP); Nobunari Tsukamoto, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 691 days.

(21) Appl. No.: 17/312,177

(22) PCT Filed: Nov. 1, 2019

(86) PCT No.: PCT/JP2019/043022
§ 371 (c)(1),
(2) Date: Jun. 9, 2021

(87) PCT Pub. No.: WO2020/129430
PCT Pub. Date: Jun. 25, 2020

(65) Prior Publication Data
US 2021/0395073 A1 Dec. 23, 2021

(30) Foreign Application Priority Data

Dec. 19, 2018 (JP) .................... 2018-237762
Dec. 19, 2018 (JP) .................... 2018-237763

(51) Int. Cl.
*G02B 26/08* (2006.01)
*B81B 3/00* (2006.01)
(Continued)

(52) U.S. Cl.
CPC ........ *B81B 3/0037* (2013.01); *G02B 26/0858* (2013.01); *G02B 26/101* (2013.01);
(Continued)

(58) Field of Classification Search
CPC ............ B81B 3/0037; B81B 2201/042; B81B 2203/0109; B81B 2203/0154;
(Continued)

(56) References Cited

U.S. PATENT DOCUMENTS

| | | |
|---|---|---|
| 6,198,565 B1 | 3/2001 | Iseki et al. |
| 2005/0063038 A1 | 3/2005 | Filhol |

(Continued)

FOREIGN PATENT DOCUMENTS

| | | |
|---|---|---|
| JP | 11-231252 A | 8/1999 |
| JP | 2000-214407 A | 8/2000 |

(Continued)

OTHER PUBLICATIONS

International Search Report and Written Opinion issued on Feb. 3, 2020 in PCT/JP2019/043022 filed on Nov. 1, 2019.

(Continued)

*Primary Examiner* — Euncha P Cherry
(74) *Attorney, Agent, or Firm* — XSENSUS LLP

(57) ABSTRACT

A movable device includes a movable portion including a reflecting surface; a pair of drive beams to support the movable portion rotatably around a predetermined rotation axis with the movable portion disposed between the pair of drive beams; and a support portion configured to support the pair of drive beams. The support portion has a light passing portion on each of both sides of the movable portion in a direction intersecting with the rotation axis in a plane along the reflecting surface in a state in which the movable portion is not rotated, the light passing portion allowing light reflected by the reflecting surface to pass through the light passing portion.

18 Claims, 44 Drawing Sheets

(51) Int. Cl.
*G02B 26/10* (2006.01)
*G01S 7/481* (2006.01)
*G03B 21/00* (2006.01)

(52) U.S. Cl.
CPC ....... *B81B 2201/042* (2013.01); *G01S 7/4817* (2013.01); *G03B 21/008* (2013.01)

(58) Field of Classification Search
CPC ............ B81B 2203/058; B81B 3/0043; G02B 26/0858; G02B 26/101; G02B 27/0101; G02B 27/0149; G02B 2027/0145; G02B 2027/0152; G02B 2027/0154; G02B 2027/0178; G02B 26/105; G01S 7/4817; G03B 21/008
See application file for complete search history.

(56) References Cited

U.S. PATENT DOCUMENTS

| | | |
|---|---|---|
| 2005/0162724 A1 | 7/2005 | Orcutt |
| 2005/0253055 A1 | 11/2005 | Sprague et al. |
| 2007/0025659 A1* | 2/2007 | Yoda ................. G02B 26/0858 385/15 |
| 2008/0042052 A1 | 2/2008 | Sprague et al. |
| 2008/0143196 A1 | 6/2008 | Sprague et al. |
| 2008/0143451 A1 | 6/2008 | Sprague et al. |
| 2008/0303383 A1 | 12/2008 | Orcutt et al. |
| 2009/0027748 A1 | 1/2009 | Sprague et al. |
| 2009/0134319 A1 | 5/2009 | Sprague et al. |
| 2014/0198366 A1 | 7/2014 | Carminati et al. |
| 2017/0350759 A1 | 12/2017 | Azumi et al. |
| 2017/0374325 A1 | 12/2017 | Itoh et al. |
| 2018/0088320 A1 | 3/2018 | Yamada |
| 2018/0215608 A1 | 8/2018 | Fujishima et al. |
| 2018/0252578 A1 | 9/2018 | Suzuki et al. |
| 2018/0267293 A1 | 9/2018 | Fujishima et al. |
| 2018/0284277 A1* | 10/2018 | LaChapelle ............. G01S 17/89 |
| 2019/0031500 A1 | 1/2019 | Takimoto et al. |

FOREIGN PATENT DOCUMENTS

| | | |
|---|---|---|
| JP | 2005-122131 A | 5/2005 |
| JP | 2008-40240 | 2/2008 |
| JP | 2009-142045 A | 6/2009 |
| JP | 2010-281853 A | 12/2010 |
| JP | 2011-002673 A | 1/2011 |
| JP | 2011-176525 A | 9/2011 |
| JP | 2014-071060 A | 4/2014 |
| JP | 2014-102355 A | 6/2014 |
| JP | 2014-126715 A | 7/2014 |
| JP | 2017-129783 A | 7/2017 |
| JP | 2017-219533 A | 12/2017 |
| JP | 2018-122391 A | 8/2018 |
| JP | 2018-146242 A | 9/2018 |
| JP | 2019-152694 A | 9/2019 |

OTHER PUBLICATIONS

Japanese Office Action issued Sep. 13, 2022, in corresponding Japanese Patent Application No. 2018-237762.
Office Action issued Oct. 9, 2022 in Chinese Patent Application No. 201980083219.3, 12 pages.

* cited by examiner

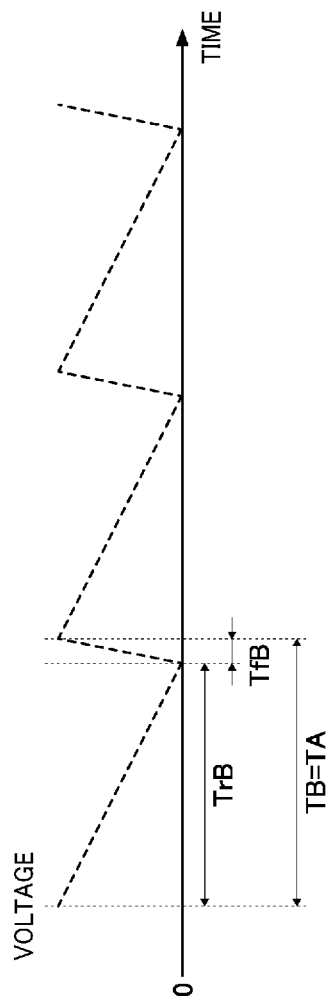

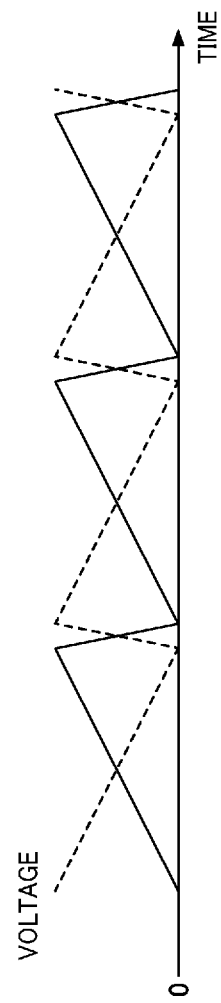

MOVABLE DEVICE, DISTANCE MEASUREMENT DEVICE, IMAGE PROJECTION APPARATUS, VEHICLE, AND MOUNT

TECHNICAL FIELD

The present disclosure relates to a movable device, a distance measurement device, an image projection apparatus, a vehicle, and a mount.

BACKGROUND ART

In recent years, with the development of micromachining technology applying semi-conductor manufacturing technology, development of micro electro mechanical systems (MEMS) devices manufactured by micromachining silicon or glass is advancing.

As a MEMS device, there is known a movable device that includes a drive beam including an elastic beam and a movable portion including a reflecting surface, which are combined as a single unit on a wafer, the drive beam also including a thin film of a piezoelectric material superposed on the elastic beam, and that drives (rotates) the movable portion using the drive beam.

Moreover, a movable device that provides scanning with light reflected by a reflecting surface by rotating a movable portion is disclosed (for example, see PTL 1). The movable device includes a support frame that surrounds the movable portion, that rotatably supports the movable portion, and that is separated.

CITATION LIST

Patent Literature

[PTL 1] JP-3552601-B

SUMMARY OF INVENTION

Technical Problem

In the movable device including the support frame surrounding the movable portion, the movable portion and the support frame are closely arranged. When the rotational angle of the movable portion increases, part of the light of scanning at the reflecting surface may be blocked by the support frame and the scanning angle with light may be limited. Regarding the device described in PTL 1, the support frame is not separated in a direction intersecting with a rotation axis, and the relationship between the separated portion and the scanning angle is not disclosed. The device does not address the problem of the limitation of the scanning angle.

The present disclosure is made in light of the above-described point and an object of the disclosure is to increase the scanning angle with light by a movable device.

Solution to Problem

A movable device according to one aspect of the disclosed technology includes a movable portion including a reflecting surface; a pair of drive beams configured to support the movable portion rotatably around a predetermined rotation axis with the movable portion disposed between the pair of drive beams; and a support portion configured to support the pair of drive beams. The support portion has a light passing portion on each of both sides of the movable portion in a direction intersecting with the rotation axis in a plane along the reflecting surface in a state in which the movable portion is not rotated, the light passing portion being configured to allow light reflected by the reflecting surface to pass through the light passing portion.

Advantageous Effects of Invention

With the disclosed technology, the scanning angle with light by the movable device can be increased.

BRIEF DESCRIPTION OF DRAWINGS

The accompanying drawings are intended to depict example embodiments of the present disclosure and should not be interpreted to limit the scope thereof. The accompanying drawings are not to be considered as drawn to scale unless explicitly noted. Also, identical or similar reference numerals designate identical or similar components throughout the several views.

FIG. 18B illustrates an example of the waveform of a drive voltage B that is applied to a piezoelectric-drive-circuit group B of the movable device.

FIG. 18C illustrates superposed waveforms of the waveform of the drive voltage A in FIG. 18A and the waveform of the drive voltage B in FIG. 18B.

DESCRIPTION OF EMBODIMENTS

Figure 1:
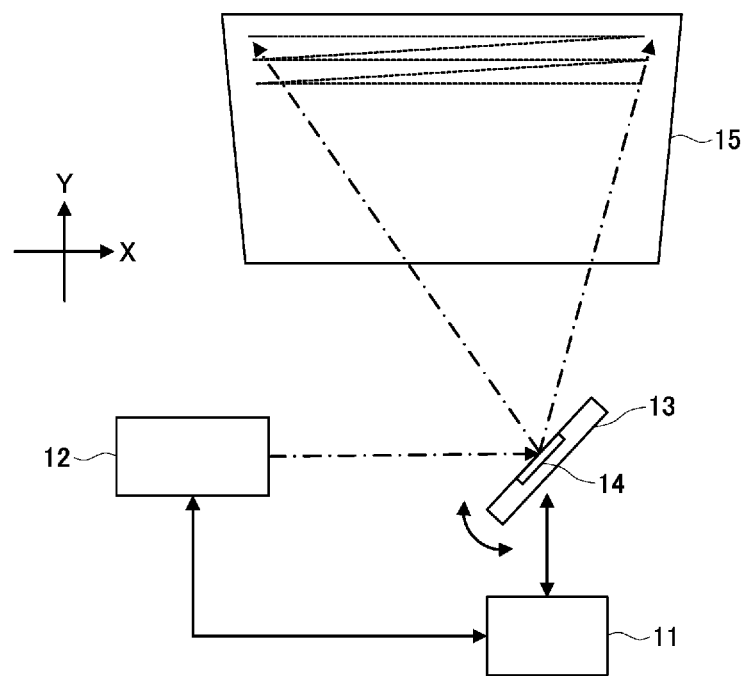
FIG. 1 is a schematic view of an example of an optical scanning system.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Embodiments of the present disclosure are described in detail referring to the drawings. Like reference signs are applied to identical or corresponding components throughout the drawings and redundant description thereof may be omitted.

An optical scanning system to which a movable device of an embodiment is applied is described in detail referring to FIGS. 1 to 4.

FIG. 1 is a schematic view of an example of an optical scanning system 10. As illustrated in FIG. 1, the optical scanning system 10 deflects light emitted from a light-source device 12 under the control of a control device 11, by using a reflecting surface 14 included in a movable device 13, so as to optically scan a target surface 15 to be scanned (hereinafter, referred to as target surface).

The optical scanning system 10 includes the control device 11, the light-source device 12, and the movable device 13 including the reflecting surface 14.

The control device 11 is, for example, an electronic circuit unit including, for example, a central processing unit (CPU) and a field-programmable gate array (FPGA). The movable device 13 is, for example, a micro electro mechanical systems (MEMS) device that includes a reflecting surface 14 and that can move the reflecting surface 14. The light-source device 12 is, for example, a laser device that emits a laser beam. The target surface 15 is, for example, a screen.

The control device 11 generates control instructions of the light-source device 12 and the movable device 13 based on acquired optical-scanning information, and outputs drive signals to the light-source device 12 and the movable device 13 based on the control instructions.

The light-source device 12 emits light based on the received drive signal. The movable device 13 moves the reflecting surface 14 in at least one of a uniaxial direction and a biaxial direction, based on the received drive signal.

With this configuration, for example, the reflecting surface 14 of the movable device 13 is biaxially moved in a reciprocating manner within a predetermined range, and the light emitted from the light-source device 12 to be incident on the reflecting surface 14 is uniaxially deflected to perform optical scanning, under the control of the control device 11, which is based on image data that is an example of the optical-scanning information. Accordingly, an image can be projected onto the target surface 15 as desired. The details of the movable device and the details of the control of the control device according to the embodiment are described later.

Figure 2:
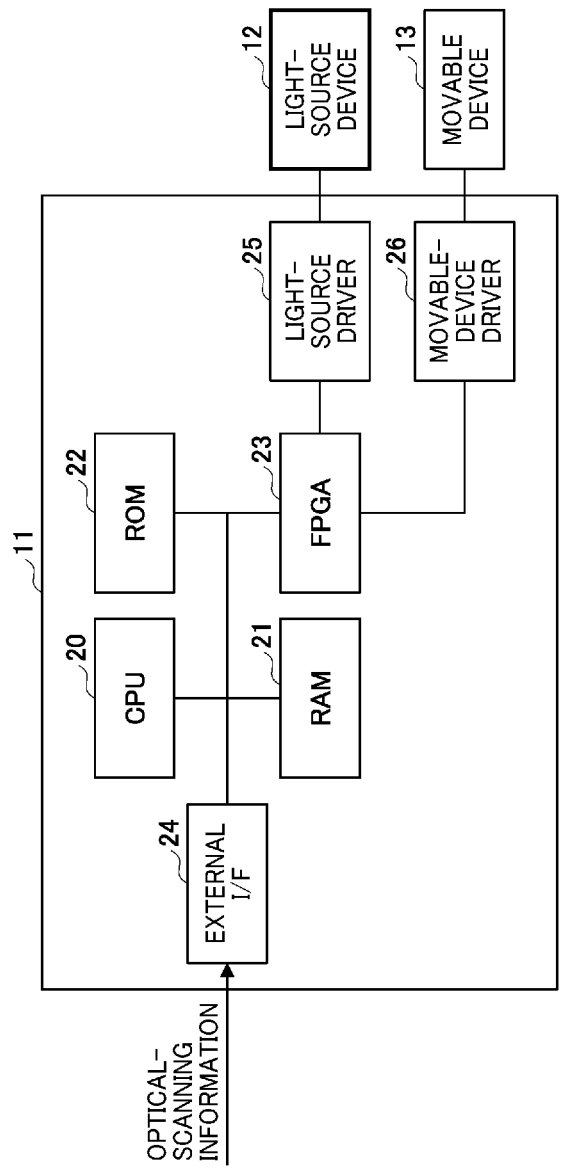
FIG. 2 is a hardware diagram of the example of the optical scanning system.

Next, the hardware configuration of an example of the optical scanning system 10 is described referring to FIG. 2. FIG. 2 is a hardware diagram of the example of the optical scanning system 10. As illustrated in FIG. 2, the optical scanning system 10 includes the control device 11, the light-source device 12, and the movable device 13, which are electrically connected to one another. The control device 11 includes a CPU 20, a random access memory (RAM) 21, a read only memory (ROM) 22, a FPGA 23, an external interface (I/F) 24, a light-source driver 25, and a movable-device driver 26.

The CPU 20 is an arithmetic device that loads into the RAM 21 a program or data from a storage device such as the ROM 22 and executes processing to provide the controls or functions of the entirety of the control device 11.

The RAM 21 is a volatile storage device that temporarily holds a program and data.

The ROM 22 is a non-volatile storage device that can hold a program and data even after the power is turned off, and stores a program and data for processing that is executed by the CPU 20 to control each function of the optical scanning system 10.

The FPGA 23 is a circuit that outputs proper control signals to the light-source driver 25 and the movable-device driver 26 in accordance with the processing performed by the CPU 20.

For example, the external I/F 24 is an interface with respect to an external device or a network. The external device may be, for example, a host device such as a personal computer (PC); or a storage device, such as a universal serial bus (USB) memory, a secure digital (SD) card, a compact disk (CD), a digital versatile disk (DVD), a hard disk drive (HDD), or a solid state drive (SSD). For example, the network may be a controller area network (CAN) of an automobile, a local area network (LAN), or the Internet. The external I/F 24 can have any configuration that can achieve connection to an external device or communication with an external device. The external I/F 24 may be provided for each external device.

The light-source driver 25 is an electric circuit that outputs a drive signal such as a drive voltage to the light-source device 12 in accordance with the received control signal.

The movable-device driver 26 is an electric circuit that outputs a drive signal such as a drive voltage to the movable device 13 in accordance with the received control signal.

In the control device 11, the CPU 20 acquires optical-scanning information from an external device or a network through the external I/F 24. As far as the CPU 20 can acquire the optical-scanning information, the optical-scanning information may be stored in the ROM 22 or the FPGA 23 in the control device 11. Alternatively, a storage device such as a SSD may be additionally provided in the control device 11 and the optical-scanning information may be stored in the storage device.

In this case, the optical-scanning information is information indicating the way of optical scanning to be performed on the target surface 15. For example, the optical-scanning information is image data when an image is displayed by optical scanning. For another example, the optical-scanning information is writing data indicating the order and portion of writing when optical writing is performed by optical scanning. For further example, the optical-scanning information is irradiation data indicating the timing and range of irradiation with light for distance measurement when distance measurement is performed by optical scanning.

The control device 11 can provide the functional configuration described below by using instructions from the CPU 20 and the hardware configuration illustrated in FIG. 2.

Figure 3:
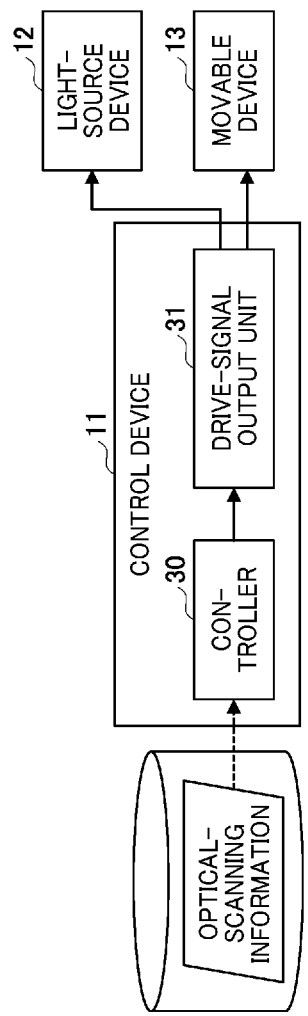
FIG. 3 is a functional block diagram of an example of a control device.

Next, the functional configuration of the control device 11 of the optical scanning system 10 is described below referring to FIG. 3. FIG. 3 is a functional block diagram of an example of the control device 11 of the optical scanning system 10.

As illustrated in FIG. 3, the control device 11 includes a controller 30 and a drive-signal output unit 31 as functions.

The controller 30 is implemented by, for example, the CPU 20, the FPGA 23, and the like. The controller 30 acquires optical-scanning information from an external device, converts the optical-scanning information into a control signal, and outputs the control signal to the drive-signal output unit 31. For example, the controller 30 acquires image data serving as the optical-scanning information from an external device or the like, generates a control signal from the image data through predetermined processing, and outputs the control signal to the drive-signal output unit 31.

The drive-signal output unit 31 is implemented by, for example, the light-source driver 25 and the movable-device driver 26. The drive-signal output unit 31 outputs a drive signal to the light-source device 12 or the movable device 13 based on the received control signal.

The drive signal is a signal for controlling the driving of the light-source device 12 or the movable device 13. For example, the drive signal of the light-source device 12 is a drive voltage used to control the irradiation timing and irradiation intensity of the light source. Moreover, for example, the drive signal of the movable device 13 is a drive voltage used to control the timing at which the reflecting surface 14 included in the movable device 13 is moved and the movable range of the reflecting surface 14.

Figure 4:
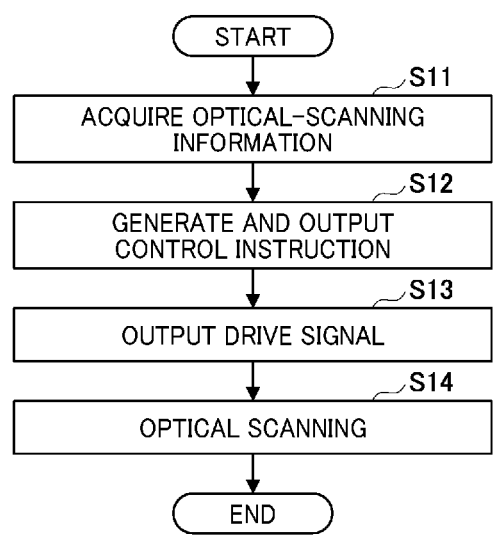
FIG. 4 is a flowchart of an example of processing relating to the optical scanning system.

Next, the process of optically scanning the target surface 15 performed by the optical scanning system 10 is described referring to FIG. 4. FIG. 4 is a flowchart of an example of processing performed by the optical scanning system 10.

In step S11, the controller 30 acquires optical-scanning information from, for example, an external device.

In step S12, the controller 30 generates control signals from the acquired optical-scanning information, and outputs the control signals to the drive-signal output unit 31.

In step S13, the drive-signal output unit 31 outputs drive signals to the light-source device 12 and the movable device 13 based on the received control signals.

In step S14, the light-source device 12 emits light based on the received drive signal. In addition, the movable device 13 moves the reflecting surface 14 based on the received drive signal. The driving of the light-source device 12 and the movable device 13 causes light to be deflected in any desired direction, and optical scanning is performed.

In the above-described optical scanning system 10, a single control device 11 has a device and a function for controlling the light-source device 12 and the movable device 13. However, a control device for the light-source device 12 and a control device for the movable device 13 may be separate elements.

In the above-described optical scanning system 10, a single control device 11 has the functions of the controller 30 and the functions of the drive-signal output unit 31 for the light-source device 12 and the movable device 13. These functions may be implemented by separate elements. For example, a drive-signal output device including a drive-signal output unit 31 may be provided in addition to the control device 11 including the controller 30. An optical deflection system that performs optical deflection may include the movable device 13 including the reflecting surface 14 and the control device 11 of the above-described optical scanning system 10.

An image projection apparatus, to which the movable device according to the embodiment is applied, is described next in detail referring to FIGS. 5 and 6.

Figure 5:
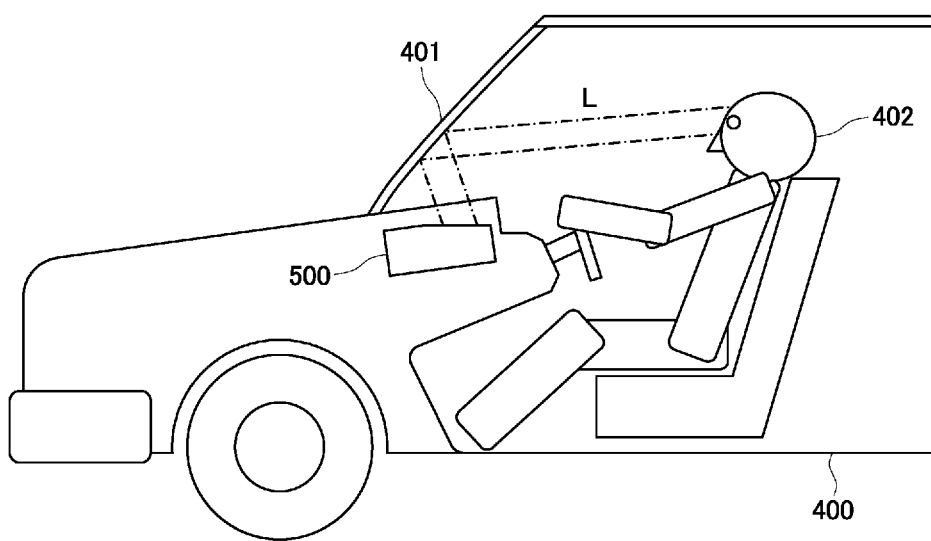
FIG. 5 is a schematic view of an example of an automobile equipped with a head-up display device (HUD).

FIG. 5 is a schematic view of an automobile 400 equipped with a head-up display (HUD) 500 as an example of an image projection apparatus according to the embodiment. FIG. 6 is a schematic view of an example of the HUD 500.

The image projection apparatus is an apparatus that projects an image by optical scanning, and is, for example, a HUD.

As illustrated in FIG. 5, for example, the HUD 500 is disposed near a windshield 401 of the automobile 400 that is an example of "a vehicle". Projection light L that is emitted from the HUD 500 is reflected by the windshield 401 and directed to an observer (a driver 402) as a user. Accordingly, the driver 402 can visually recognize an image or the like projected by the HUD 500, as a virtual image. Alternatively, a combiner may be disposed on the inner wall surface of the windshield 401 so that the user can visually recognize a virtual image formed by the projection light that is reflected by the combiner.

Figure 6:
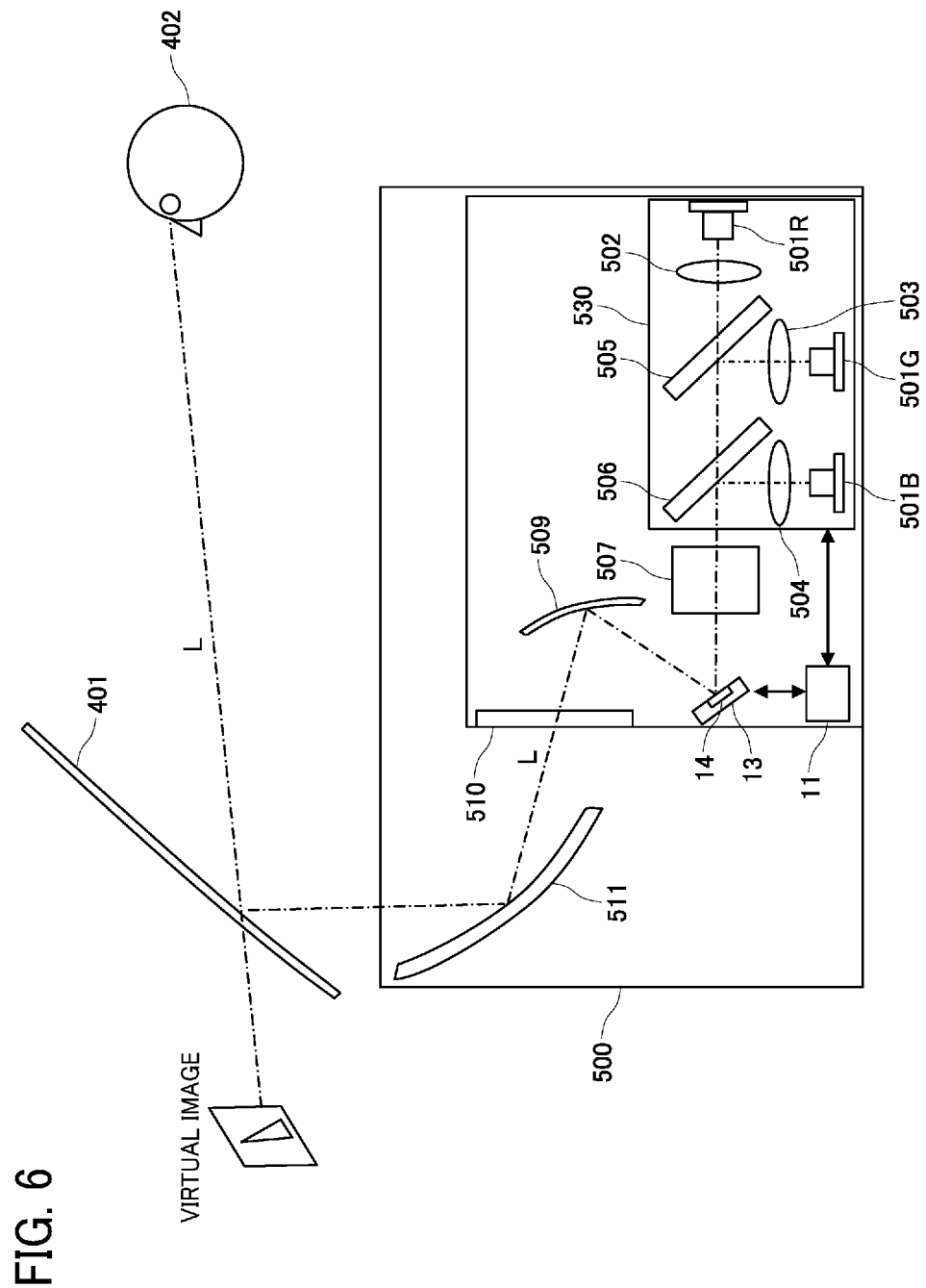
FIG. 6 is a schematic view of an example of the HUD.

As illustrated in FIG. 6, the HUD 500 emits laser beams from red, green, and blue laser-beam sources 501R, 501G, and 501B. The emitted laser beams pass through an optical system for receiving light, and then are deflected by the movable device 13 including the reflecting surface 14. The optical system includes collimator lens 502, 503, and 504 provided for the laser-beam sources 501R, 501G, and 501B, respectively, two dichroic minors 505 and 506, and a light-intensity adjustor 507. The deflected laser beams pass through a projection optical system, and are projected onto a screen. The projection optical system includes a free-form surface mirror 509, an intermediate screen 510, and a projection mirror 511. In the HUD 500, the laser-beam sources 501R, 501G, and 501B, the collimator lenses 502, 503, and 504, and the dichroic mirrors 505 and 506 are combined as a single unit, i.e., a light-source unit 530 in an optical housing.

The HUD 500 projects an intermediate image displayed on the intermediate screen 510 onto the windshield 401 of the automobile 400 to allow the driver 402 to visually recognize the intermediate image as a virtual image.

The laser beams of RGB colors emitted from the laser-beam sources 501R, 501G, and 501B are approximately collimated by the collimator lens 502, 503, and 504, and are combined by the two dichroic mirrors 505 and 506. The light intensity of the combined laser beams is adjusted by the light-intensity adjuster 507, and then two-dimensional scanning is performed by the movable device 13 including the reflecting surface 14. The projection light L used for two-dimensional scanning by the movable device 13 is reflected by the free-form surface mirror 509 so as to correct the distortion, and then is focused onto the intermediate screen 510. Accordingly, an intermediate image is displayed. The intermediate screen 510 includes a microlens array in which a plurality of microlenses are two-dimensionally arranged, and enlarges the projection light L incident on the intermediate screen 510 in units of microlens.

The movable device 13 moves the reflecting surface 14 biaxially in a reciprocating manner to perform two-dimensional scanning with the projection light L incident on the reflecting surface 14. The driving of the movable device 13 is controlled in synchronization with the light-emitting timings of the laser-beam sources 501R, 501G, and 501B.

The HUD 500 is described above as an example of the image projection apparatus. However, no limitation is indicated thereby, and the image projection apparatus may be any apparatus that performs optical scanning, using the movable device 13 including the reflecting surface 14, to project an image. For example, the present disclosure is also applicable to a projector that is placed on a desk or the like and projects an image on a display screen, a head-mounted display device that is incorporated in a wearable member on the head of the observer, for example, and that projects an image on a reflective-and-transmissive screen of the wearable member or on an eyeball as a screen, and the like.

The image projection apparatus may be incorporated in, not only the vehicle or the wearable member, but also, for example, a mobile body such as an aircraft, a ship, or a mobile robot; or an immobile body such as an operation robot that operates a driving target such as a manipulator without moving from the installed location.

Figure 7:
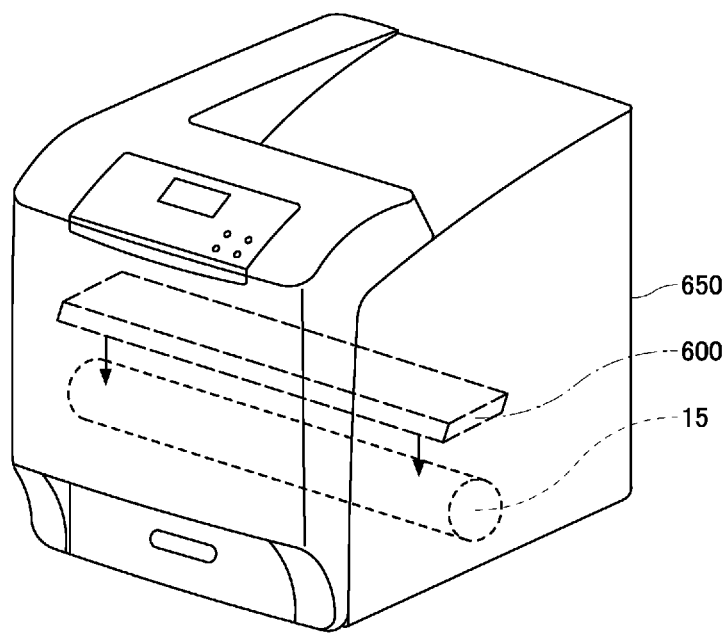
FIG. 7 is a schematic view of an example of an image forming apparatus equipped with an optical writing device.
Figure 8:
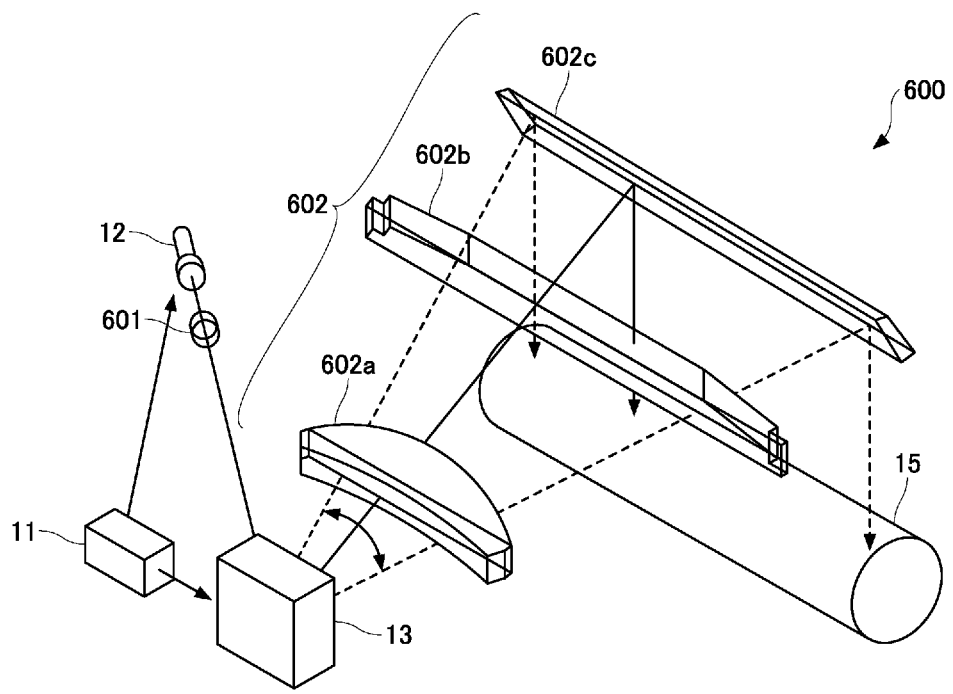
FIG. 8 is a schematic view of an example of the optical writing device.

Next, an optical writing device to which the movable device 13 according to the embodiment is applied is described in detail referring to FIGS. 7 and 8.

FIG. 7 illustrates an example of an image forming apparatus equipped with an optical writing device 600. FIG. 8 is a schematic view of an example of the optical writing device 600.

As illustrated in FIG. 7, the optical writing device 600 is used as a component of an image forming apparatus typified by a laser printer 650, for example, having a printer function using laser beams. In the image forming apparatus, the optical writing device 600 performs optical scanning on a photoconductor drum, which is the target surface 15, by using one or more laser beams, thereby performing optical writing on the photoconductor drum.

As illustrated in FIG. 8, in the optical writing device 600, the laser beam from the light-source device 12 such as a laser element passes through an image forming optical system 601 such as a collimator lens and is then deflected uniaxially or biaxially by the movable device 13 including the reflecting surface 14. The laser beam deflected by the movable device 13 then passes through a scanning optical system 602 including a first lens 602a, a second lens 602b, and a reflecting minor 602c, and is emitted onto the target surface 15 (for example, a photoconductor drum or photo-sensitive paper), and thereby optical writing is performed. The scanning optical system 602 forms an image of a laser beam in the form of a spot on the target surface 15. The light-source device 12 and the movable device 13 including the reflecting surface 14 are driven based on the control of the control device 11.

As described above, the optical writing device 600 can be used as a component of the image forming apparatus having a printer function using laser beams. Moreover, by employing another scanning optical system to perform scanning in a biaxial manner in addition to the uniaxial manner, the optical writing device 600 can be also used as a component of an image forming apparatus such as a laser label apparatus that deflects laser beams to perform optical scanning on thermal media and print letters by heating.

The movable device 13 including the reflecting surface 14 to be applied to the optical writing device is advantageous in saving power of the optical writing device because power consumption for driving the movable device 13 is less than that for driving a rotational polygon minor or the like. The movable device 13 makes a smaller wind noise when the mirror substrate oscillates compared with a rotational polygon minor, and thus is advantageous in achieving low noise of the optical writing device. The optical writing device requires much smaller installation space than the installation space of a rotational polygon mirror, and the amount of heat generated by the movable device 13 is small. Accordingly, downsizing is easily achieved, and thus the optical writing device is advantageous in downsizing the image forming apparatus.

Figure 9:
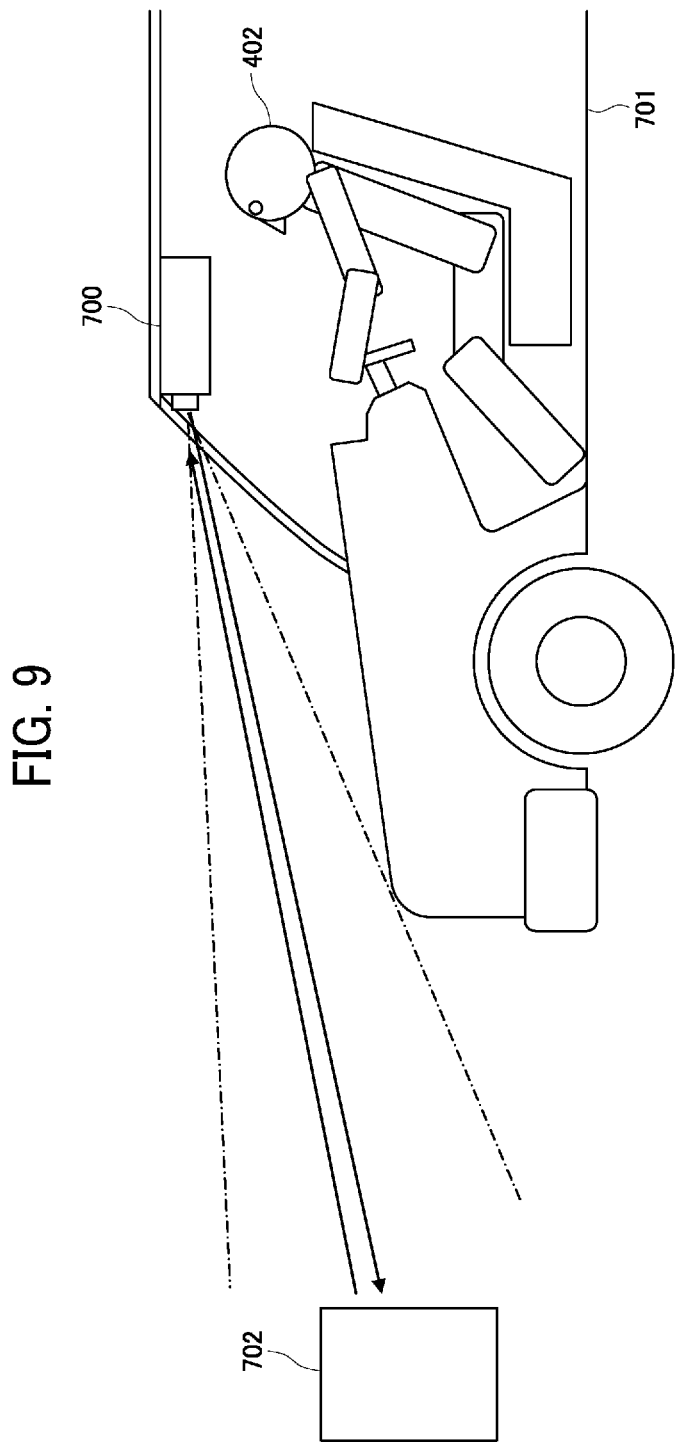
FIG. 9 is a schematic view of another example of an automobile equipped with a laser imaging detection and ranging (LiDAR) device.
Figure 10:
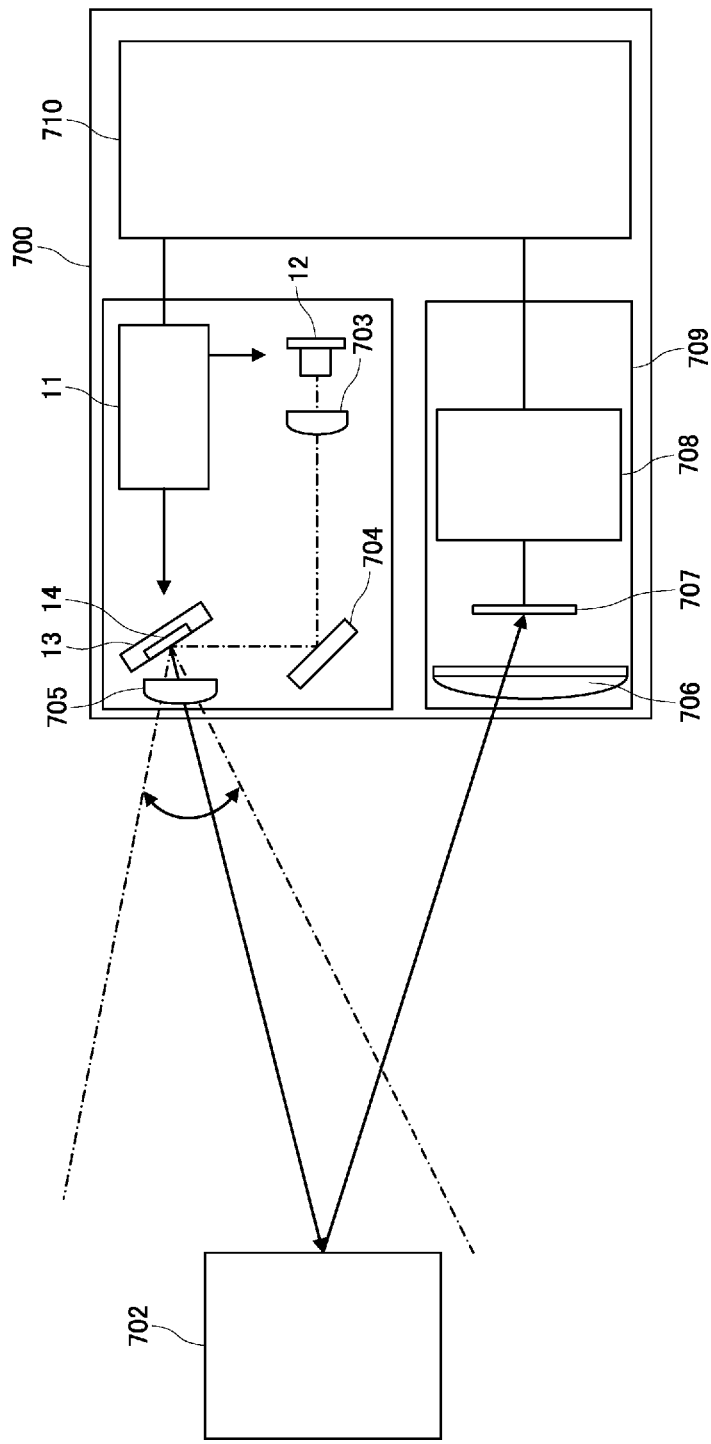
FIG. 10 is a schematic view of an example of the LiDAR device.

Next, a distance measurement device to which the movable device according to the embodiment is applied is described in detail referring to FIGS. 9 and 10.

FIG. 9 is a schematic view of an automobile equipped with a laser imaging detection and ranging (LiDAR) device as an example of a distance measurement device. FIG. 10 is a schematic view of an example of the LiDAR device.

The distance measurement device is a device that measures a distance in a target direction, and is, for example, a LiDAR device.

As illustrated in FIG. 9, for example, a LiDAR device 700 is mounted on an automobile 701 that is an example of "a vehicle". The LiDAR device 700 performs optical scanning in a target direction and receives the light reflected from an object 702 that exists in the target direction, to measure the distance from the object 702.

As illustrated in FIG. 10, the laser beams emitted from the light-source device 12 pass through an incidence optical system, and then are caused to perform scanning uniaxially or biaxially using the movable device 13 including the reflecting surface 14. The incidence optical system includes a collimator lens 703 that serves as an optical system that collimates divergent beams into approximately parallel beams, and a planar mirror 704. The parallel beams are emitted to the object 702 ahead of the device, as passing through, for example, a projection lens 705 that serves as a projection optical system. The driving of the light-source device 12 and the movable device 13 is controlled by the control device 11. The light reflected by the object 702 is detected by a photodetector 709. More specifically, the reflected light passes through, for example, a condenser lens 706 that serves as an incident-light receiving and detecting optical system, and is received by an image sensor 707. Then, the image sensor 707 outputs a detected signal to a signal processing circuit 708. The signal processing circuit 708 performs predetermined processing on the received detected signal, such as binarization or noise processing, and outputs the result to a distance measuring circuit 710.

The distance measuring circuit 710 determines whether the object 702 is present based on the time difference between the timing at which the light-source device 12 emits laser beams and the timing at which the photodetector 709 receives the laser beams or the phase difference per pixel of the image sensor 707 that have received the laser beams. Moreover, the distance measuring circuit 710 calculates distance information indicating the distance from the object 702.

The movable device 13 including the reflecting surface 14 is less likely broken and is compact compared with a polygon mirror, and thus, a highly durable and compact LiDAR device can be provided. Such a LiDAR device is attached to, for example, a vehicle, an aircraft, a ship, a robot, or the like, and can perform optical scanning within a predetermined range to determine whether an obstacle is present or to measure the distance from the obstacle. The installation position of the LiDAR device 700 is not limited to an upper and front portion of the automobile 701, and the LiDAR device 700 may be mounted at a side surface or a rear portion of the automobile 701.

The LiDAR device 700 is described as an example of the distance measurement device. However, no limitation is intended thereby. The distance measurement device may be any device that performs optical scanning by controlling the movable device 13 including the reflecting surface 14, using the control device 11, and that receives the reflected light using a photodetector to measure the distance from the object 702.

For example, the present disclosure is also applicable to a biometric authentication apparatus, a security sensor, or a component of a three-dimensional scanner, for example. The biometric authentication apparatus performs optical scanning on a hand or face to obtain distance information, calculates object information such as the shape of the object based on the distance information, and refers to records to recognize the object. The security sensor performs optical scanning in a target range to recognize an incoming object. The three-dimensional scanner performs optical scanning to obtain distance information, calculates object information such as the shape of the object based on the distance information to recognize the object, and outputs the object information in the form of three-dimensional data.

Figure 11:
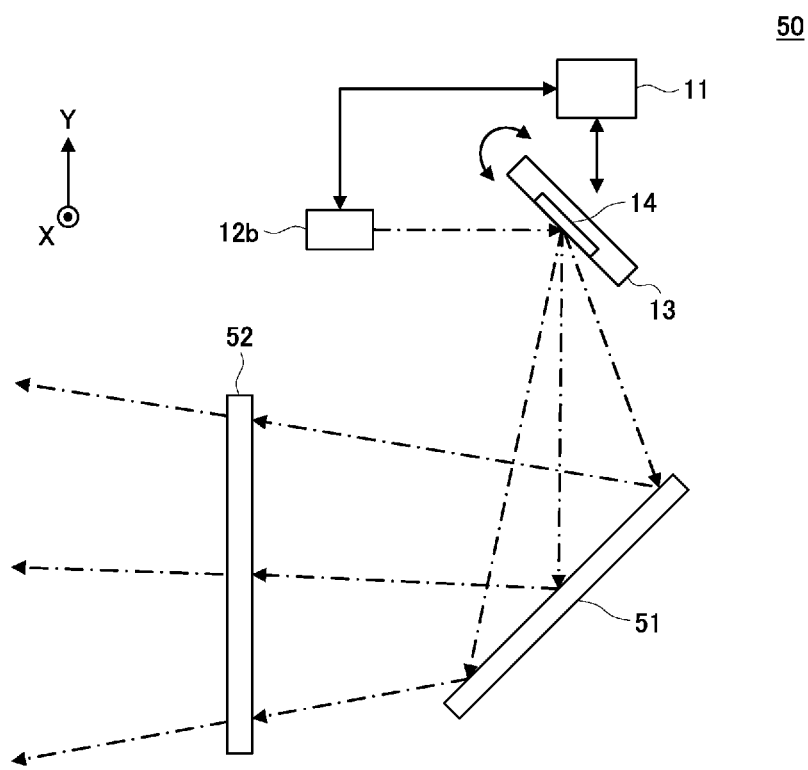
FIG. 11 is a schematic view of an example of a configuration of a laser headlamp.

Next, a laser headlamp 50 in which the movable device of the embodiment is applied to a headlight of an automobile is described referring to FIG. 11. FIG. 11 is a schematic view of an example of a configuration of the laser headlamp 50.

The laser headlamp 50 includes a control device 11, a light-source device 12b, a movable device 13 including a reflecting surface 14, a minor 51, and a transparent plate 52.

The light-source device 12b is a light source that emits blue laser beams. The laser beams emitted from the light-source device 12b are incident on the movable device 13 and are reflected by the reflecting surface 14. The movable device 13 moves the reflecting surface 14 in the XY-direction based on the signal from the control device 11, and performs two-dimensional scanning using blue laser beams emitted from the light-source device 12b in the XY-direction.

The scanning light of the movable device 13 is reflected by the minor 51, and is incident on the transparent plate 52. The transparent plate 52 is coated with a yellow phosphor on the front surface or the back surface. The blue laser beams that are reflected by the minor 51 are converted into white light whose color is within the range of the statutory color for a headlight as passing through the yellow phosphor (fluorescent material) of the transparent plate 52. Thereby, the front of the automobile is illuminated with white light from the transparent plate 52.

The scanning light of the movable device 13 scatters in a predetermined manner as passing through the fluorescent material of the transparent plate 52. Accordingly, glare is attenuated at an illuminated target in the area ahead of the automobile.

When the movable device 13 is applied to a headlight of an automobile, the color of light beams from the light-source device 12b and the color of the phosphor are not limited to blue and yellow, respectively. For example, the light-source device 12b may emit near-ultraviolet light, and the transparent plate 52 may be coated with homogenized mixture of a plurality of kinds of fluorescent materials of red-green-blue (RGB) trichromatic colors. In this case as well, the light passing through the transparent plate 52 can be converted into white light, and the front of the automobile can be illuminated with white light.

Figure 12:
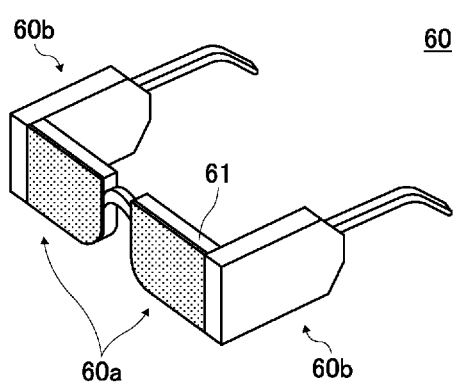
FIG. 12 is a schematic perspective view of an example of a configuration of a head-mounted display (HMD).
Figure 13:
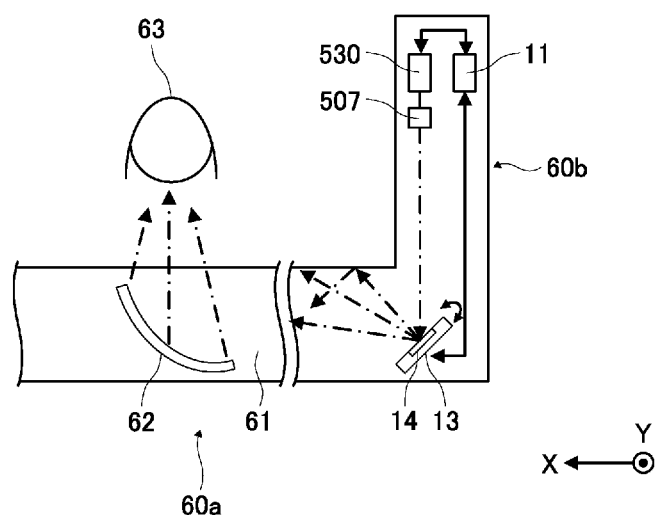
FIG. 13 illustrates an example of part of the configuration of the HMD.

Next, a head-mounted display (HMD) 60 to which the movable device 13 according to the embodiment is applied is described referring to FIGS. 12 and 13. Note that the HMD 60 is a head-mounted display that can be mounted on a human head, and can be shaped like, for example, glasses.

FIG. 12 is a perspective view of the appearance of the HMD 60. In FIG. 12, the HMD 60 includes a pair of a front 60a and a temple 60b provided substantially symmetrically on each of the left and right. The front 60a can include, for example, a light guide plate 61. An optical system, a control device, and the like, can be incorporated in the temple 60b.

FIG. 13 illustrates a partial configuration of the HMD 60. Although the configuration for the left eye is illustrated in FIG. 13, the HMD 60 has a configuration similar to that for the right eye.

The HMD 60 includes a control device 11, a light source unit 530, a light-intensity adjuster 507, a movable device 13 including a reflecting surface 14, a light guide plate 61, and a half minor 62.

The light source unit 530 according to the present embodiment includes the laser-beam sources 501R, 501G, and 501B, the collimator lens 502, 503, and 504, and the dichroic mirrors 505 and 506, and these elements are combined as a single unit in an optical housing. In the light source unit 530, the laser beams of the RGB colors that are emitted from the laser-beam sources 501R, 501G, and 501B are combined by the two dichroic mirrors 505 and 506. The light source unit 530 emits combined parallel light.

The light intensity of the combined laser beams from the light source unit 530 is adjusted by the light-intensity adjuster 507, and then the light is incident on the movable device 13. The movable device 13 moves the reflecting surface 14 in the XY-direction based on the signal from the control device 11, and performs two-dimensional scanning with the light emitted from the light source unit 530. The driving of the movable device 13 is controlled in synchronization with the light emission timings of the laser-beam sources 501R, 501G, and 501B, and a color image is formed with the scanning light.

The scanning light of the movable device 13 is incident on the light guide plate 61. The light guide plate 61 guides the scanning light to the half mirror 62 while reflecting the scanning light on the inner wall surface. The light guide plate 61 is formed of a material such as a resin having transmissivity for the wavelength of the scanning light.

The half minor 62 reflects the light from the light guide plate 61 to the back side of the HMD 60, and emits the light in the direction of the eyes of a wearer 63 of the HMD 60. The half mirror 62 has, for example, a free-form surface shape. The image of the scanning light is reflected by the half mirror 62, and then is formed on the retina of the wearer 63. The image of the scanning light is formed on the retina of the wearer 63 due to the reflection at the half minor 62 and the effect of the crystalline lenses of eyeballs. Moreover, due to the reflection at the half mirror 62, the spatial distortion of the image is corrected. The wearer 63 can observe an image formed by the light of scanning in the XY direction.

The wearer 63 observes an image of external light superposed on the image of the scanning light because of the half mirror 62. Alternatively, a mirror may be provided instead of the half minor 62 so that external light is blocked out and the wearer 63 observes only the image of the scanning light.

Figure 14:
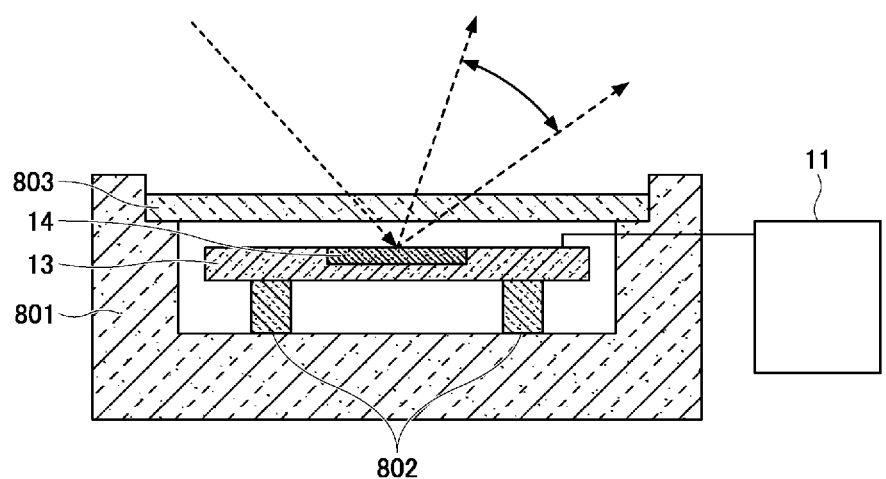
FIG. 14 is a schematic view of an example of a packaged movable device.

Next, packaging of the movable device 13 according to the embodiment is described referring to FIG. 14.

FIG. 14 is a schematic view of an example a packaged movable device 13.

As illustrated in FIG. 14, the movable device 13 is mounted on a mounting member 802 inside a package member 801. The package member 801 is partly covered with and sealed by a transmissive member 803 so that the movable device 13 is packaged. The package contains inert gas such as nitrogen and is sealed. This configuration can prevent the deterioration of the movable device 13 due to oxidation, and increase the durability against changes in environment such as temperature.

A movable device according to a first embodiment that is used for the above-described optical deflection system, optical scanning system, image projection apparatus, optical writing device, and distance measurement device is described.

Figure 15:
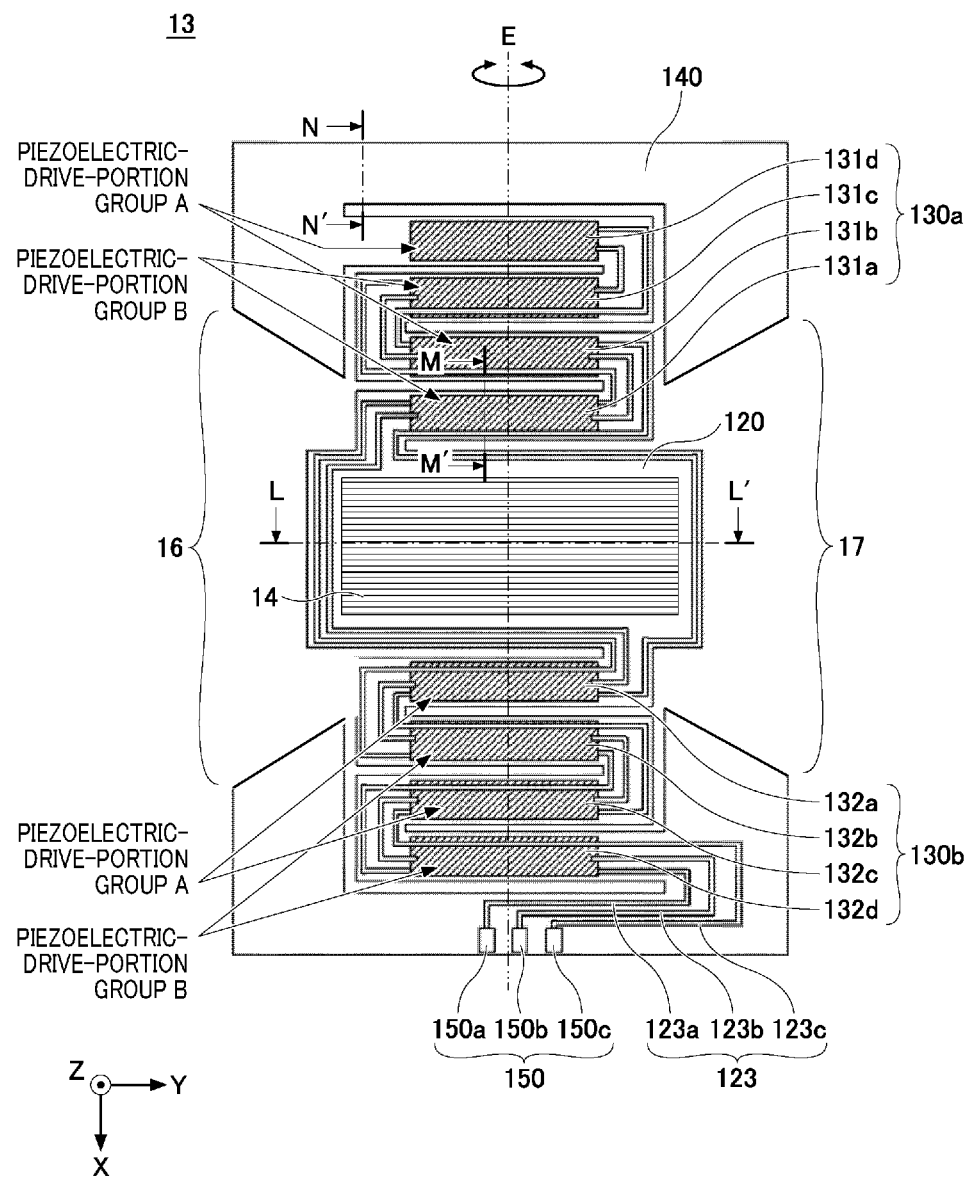
FIG. 15 is a plan view of an example of the movable device when viewed in the +Z direction.

The configuration of the movable device according to the first embodiment is described referring to FIGS. 15 and 16.

Figure 16A:
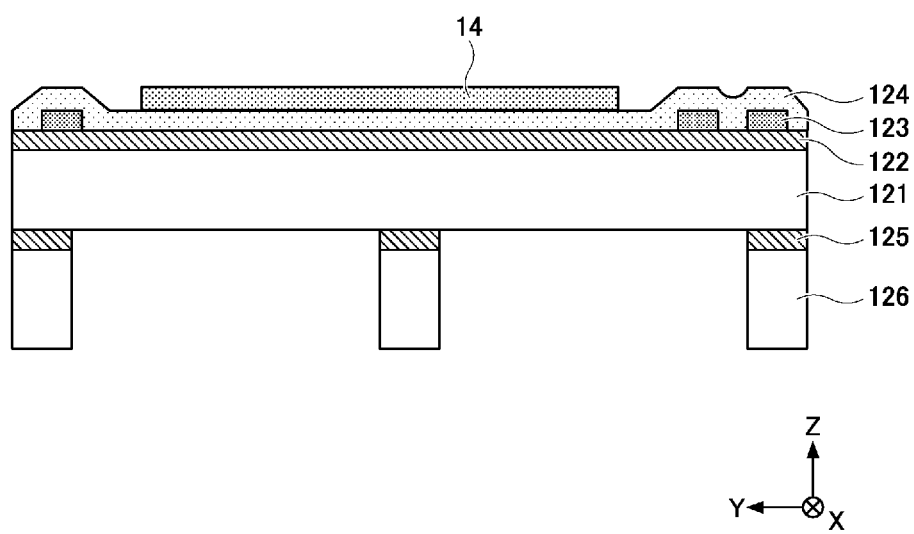
FIG. 16A is a cross-sectional view of the movable device taken along line L-L' in FIG. 15.
Figure 16B:
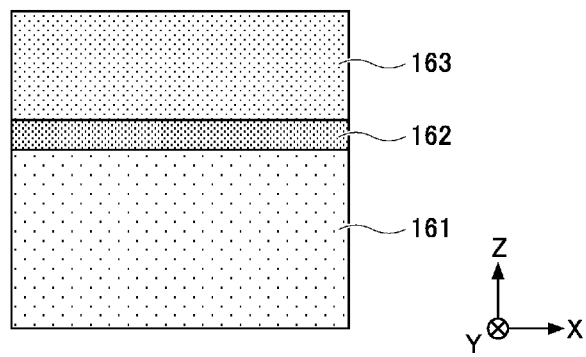
FIG. 16B is a cross-sectional view of the movable device taken along line N-N' in FIG. 15.
Figure 16C:
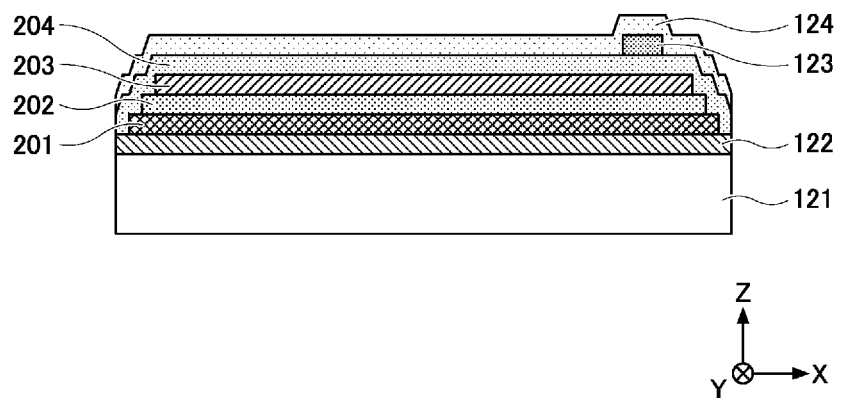
FIG. 16C is a cross-sectional view of the movable device taken along line M-M' in FIG. 15.

FIG. 15 is a plan view of a movable device that is doubly supported and can uniaxially deflect light. FIGS. 16A to 16C are each a cross-sectional view of the movable device, FIG. 16A being a cross-sectional view taken along line L-L' in FIG. 15, FIG. 16B being a cross-sectional view taken along line N-N' in FIG. 15, FIG. 16C being a cross-sectional view taken along line M-M' in FIG. 15.

As illustrated in FIG. 15, the movable device 13 includes a rectangular reflecting surface 14 that reflects incident light, a movable portion 120 including the reflecting surface 14, drive beams 130a and 130b that are coupled to the movable portion 120 and that drive the reflecting surface 14 and the movable portion 120 around an E-axis parallel to the X-axis, a support portion 140 that supports the drive beams 130a and 130b, and an electrode connection portion 150 that is electrically connected to the drive beams 130a and 130b and a control device.

Moreover, the wiring portion 123 that transmits a current or voltage signal applied via the electrode connection portion 150 is provided in a region on the movable portion 120 other than the reflecting surface 14 and on the drive beams 130a and 130b.

In this case, the E-axis is an example of "a rotation axis", and the drive beams 130a and 130b are an example of "a pair of drive beams". FIG. 15 illustrates the reflecting surface 14 as an example of a rectangular reflecting surface; however, it is not limited thereto, and the shape of a reflecting surface may be another shape, such as a circle or an ellipsoid.

The movable device 13 includes, for example, one silicon on insulator (SOI) substrate that is formed by any appropriate treatment method, such as etching. On the formed SOI substrate, the reflecting surface 14, piezoelectric drive circuits 131a to 131d, and 132a to 132d, and the electrode connection portion 150 are formed, which constitutes an integral structure of the above-described components. The above-described multiple components may be formed after the SOI substrate is formed, or may be formed while the SOI substrate is being formed. The piezoelectric drive circuits 131a to 131d, and 132a to 132d are each an example of "a beam".

The SOI substrate is a substrate in which, on a first silicon layer formed of single crystal silicon (Si), a silicon oxide layer is formed, and on the silicon oxide layer, a second silicon layer formed of single crystal silicon is further formed. Hereinafter, the first silicon layer is referred to as silicon support layer, and the second silicon layer is referred to as silicon active layer.

The silicon active layer has a smaller thickness in the Z-axis direction than the thickness in the X-axis direction or the Y-axis direction. With such a configuration, any member made of the silicon active layer serves as an elastic member having elasticity.

The SOI substrate does not have to be planar, and may have, for example, a curvature. As long as the substrate can be integrally processed by etching or the like and can be partly elastic, the member used for forming the movable device 13 is not limited to the SOI substrate.

As illustrated in FIG. 16A, the movable portion 120 includes a silicon active layer 121, an interlayer insulating film 122 on the +Z surface of the silicon active layer 121, a wiring portion 123 and a protection film 124 on the +Z surface of the interlayer insulating film 122, and a reflecting surface 14 on the +Z surface of the protection film 124. The movable portion 120 also includes a buried oxide (BOX) layer 125 on the −Z surface of the silicon active layer 121, and a silicon support layer 126 on the −Z surface of the BOX layer 125.

The interlayer insulating film 122 is made of silicon oxide or the like. The wiring portion 123 is made of aluminum (Al). The protection film 124 is made of silicon oxide or photosensitive polyimide. The reflecting surface 14 is made of a metal thin film containing aluminum, gold, silver, or the like. The protection film 124 is transparent.

The BOX layer 125 is made of, for example, silicon oxide. The BOX layer 125 and the silicon support layer 126 can act as a reinforcing rib to prevent the distortion of the reflecting surface 14 due to the motion.

Referring to FIG. 16B, the support portion 140 is a frame-shaped support body including a silicon support layer 161, a silicon oxide layer 162, and a silicon active layer 163, and surrounding the movable portion 120 and the drive beams 130a and 130b.

As illustrated in FIG. 15, the support portion 140 has light passing portions 16 and 17 on both sides of the movable portion 120 in the Y direction in FIG. 15 (a direction intersecting with the E-axis in a plane along the reflecting surface 14 in a state in which the movable portion 120 is not rotated) by opening (removing) part of the support portion 140. The light passing portions 16 and 17 allow the light reflected by the reflecting surface 14 to pass therethrough when the movable portion 120 is rotated.

Since the light passing portions 16 and 17 are provided, a portion of the support portion 140 coupled to the drive beam 130a is separated from a portion of the support portion 140 coupled to the drive beam 130b via the light passing portions 16 and 17.

Moreover, the light passing portions 16 and 17 have shapes in which the widths of the light passing portions 16 and 17 in a direction along the E-axis are widened in a tapered manner as the widths are farther from the E-axis.

While the support portion 140 is an example of a frame-shaped support body including the light passing portions 16 and 17, it is not limited thereto. As far as the light passing portions 16 and 17 are provided, the support portion 140 may be a beam-shaped support body in which two beams sandwich the movable portion 120 and the drive beams 130a and 130b.

Moreover, in the above-described example, the light passing portions 16 and 17 have the shapes in which the widths of the light passing portions 16 and 17 in the direction along the E-axis are widened in a tapered manner as the widths are farther from the E-axis; however, it is not limited thereto. As far as the light passing portions 16 and 17 allow the light reflected by the reflecting surface 14 to pass therethrough when the movable portion 120 is rotated, the shapes of the light passing portions 16 and 17 may be any shapes.

Furthermore, in the above-described example, the light passing portions 16 and 17 are formed by opening (removing) part of the support portion 140; however, it is not limited thereto. For example, a member (a transparent member) having transmissivity for the light reflected by the reflecting surface 14 may form the support portion 140 on both sides of the movable portion 120, and the light reflected by the reflecting surface 14 may be transmitted through the transparent member. In other words, the light passing portions 16 and 17 may include a light transmissive portion that allows the light reflected by the reflecting surface 14 to pass therethrough via the transparent member, without being limited to the configuration that allows light to simply pass therethrough.

Next, the drive beams 130a and 130b include, for example, a plurality of piezoelectric drive circuits 131a to 131d, and 132a to 132d that are joined so as to turn. One end of each of the drive beams 130a and 130b is coupled to an outer peripheral portion of the movable portion 120, and the other end of each of the drive beams 130a and 130b is coupled to an inner peripheral portion of the support portion 140. In this case, a position to couple the drive beam 130a with the movable portion 120 and a position to couple the drive beam 130b with the movable portion 120 are point-symmetric with respect to the center point of the reflecting surface 14. In addition, a position to couple the drive beam 130a with the support portion 140a and a position to couple the drive beam 130b with the support portion 140b are point-symmetric with respect to the center point of the reflecting surface 14.

As illustrated in FIG. 16C, the drive beams 130a and 130b each include an interlayer insulating film 122, a lower electrode 201, a piezoelectric portion 202, an upper electrode 203, an interlayer insulating film 204, a wiring portion 123, and a protection film 124 that are formed in that order on the +Z surface of the silicon active layer 121 that serves as an elastic member.

Each of the upper electrode 203 and the lower electrode 201 is made of, for example, gold (Au) or platinum (Pt). For example, the piezoelectric portion 202 is made of lead zirconate titanate (PZT), which is a piezoelectric material.

The electrode connection portion 150 includes a positive electrode connection portion 150a to which a positive voltage is applied, a ground (GND) connection portion 150b coupled to the GND, and a negative electrode connection portion 150c to which a negative voltage is applied, the respective portions being formed on the +Z surface of the support portion 140.

The electrode connection portion 150 is electrically connected to the upper electrode 203 and the lower electrode 201 of each of the piezoelectric drive circuits 131a and 131d, and 132a to 132d via the wiring portion 123, and is electrically connected to the control device 11 via electrode wiring of aluminum (Al) or the like. The upper electrode or the lower electrode may be directly coupled to the electrode connection portion. Alternatively, the upper electrode and the lower electrode may be coupled to each other, to be indirectly coupled to the electrode connection portion.

The wiring portion 123 includes a positive voltage wiring portion 123a to which a positive voltage signal is transmitted, a GND wiring portion 123b coupled to the GND, and a negative voltage wiring portion 123c to which a negative voltage signal is transmitted. The positive voltage wiring portion 123a is coupled to the positive electrode connection portion 150a. The GND wiring portion 123b is coupled to the GND connection portion 150b. The negative voltage wiring portion 123c is coupled to the negative electrode connection portion 150c.

More specifically, the GND wiring portion 123b is coupled to the upper electrode 203 of each of the piezoelectric drive circuits 131a to 131d, and 132a to 132d. Moreover, the positive voltage wiring portion 123a is coupled to the lower electrode 201 of each of the piezoelectric drive circuits 132d, 132b, 131a, and 131c, transmits a positive voltage signal thereto, and applies a positive drive voltage thereto. In this case, the positive voltage wiring portion 123a is not coupled to the lower electrode 201 of each of the piezoelectric drive circuits 132c, 132a, 131b, and 131d, and passes through the piezoelectric drive circuits 132c, 132a, 131b, and 131d.

The negative voltage wiring portion 123c is coupled to the lower electrode 201 of each of the piezoelectric drive circuits 132c, 132a, 131b, and 131d, transmits a negative voltage signal thereto, and applies a negative drive voltage thereto. In this case, the negative voltage wiring portion 123c is not coupled to the lower electrode 201 of each of the piezoelectric drive circuits 132d, 132b, 131a, and 131c, and passes through the piezoelectric drive circuits 132d, 132b, 131a, and 131c.

In this way, the wiring portion 123 can transmit a voltage signal applied through the electrode connection portion 150 to the piezoelectric drive circuits 131a to 131d, and 132a to 132d, and can apply a drive voltage. Alternatively, the wiring portion 123 may transmit a current signal instead of the voltage signal.

The motion of the piezoelectric drive circuit by application of a drive voltage will be described later with reference to FIGS. 17A to 17D.

In this case, in the interlayer insulating film 204 provided with the wiring portion 123, the insulating layer may be partly removed or may not be partly provided as an opening at a coupling spot where the upper electrode 203 or the lower electrode 201 and the electrode wiring are coupled. Thus, the drive beams 130a and 130b, and the electrode wiring can be designed with a higher degree of freedom, and furthermore, a short circuit due to contact between electrodes can be suppressed. The silicon oxide film constituting the interlayer insulating film 204 and the like also serves as an anti-reflection member.

Although this embodiment has illustrated an example in which the piezoelectric portion 202 is formed on only one surface (+Z surface) of the silicon active layer 121 serving as the elastic member, the piezoelectric portion 202 may be formed on another surface (for example, -Z surface) of the elastic member, or on both the one surface and the other surface of the elastic member.

The shapes of the components are not limited to the shapes in the embodiment as long as the movable portion 120 can be driven around the E-axis.

Control Method of Movable Device According to First Embodiment

Next, the control by the control device that drives the drive beams of the movable device is described in detail.

The piezoelectric portions 202 of the drive beams 130a and 130b, when a positive or negative voltage in the polarization direction is applied thereto, are deformed (for example, expanded or contracted) in proportion to the potential of the applied voltage, and exhibit inverse piezoelectric effect. The drive beams 130a and 130b move the movable portion 120 by using the inverse piezoelectric effect.

In this case, the angle defined by the reflecting surface 14 of the movable portion 120 with respect to the XY plane when the reflecting surface 14 is inclined to the +Z direction or -Z direction with respect to the XY plane is referred to as deflection angle. In particular, the +Z direction represents a positive deflection angle and the -Z direction represents a negative deflection angle.

The control by the control device that drives the drive beams is described referring to FIGS. 17A to 17D.

FIGS. 17A to 17D are schematic views schematically illustrating driving of the drive beam 130b of the movable device 13. Parts indicated by dotted lines are the movable portion 120 and other parts. The right side in a view facing the drawing is the +X direction, the upper side in a view facing the drawing is the +Y direction, and the near side in a view facing the drawing is the +Z direction.

Figure 17A:
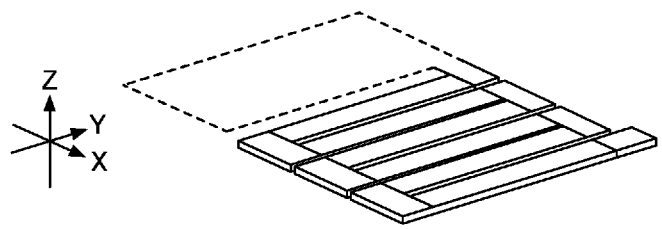
FIG. 17A is a schematic view when drive beams of the movable device are deformed.

As illustrated in FIG. 17A, the deflection angle by the drive beam 130b is zero when the drive voltage is not applied to the drive beam 130b.

Figure 17B:
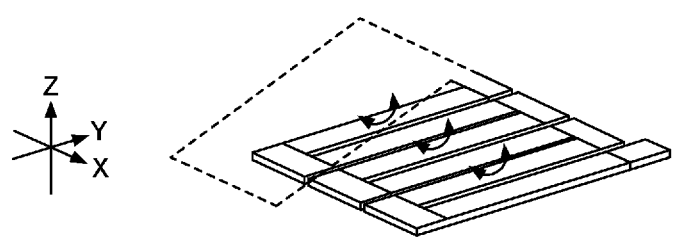
FIG. 17B is a schematic view when the drive beams of the movable device are deformed.

Among the plurality of piezoelectric drive circuits 131a to 131d of the drive beam 130a, the piezoelectric drive circuits 131b and 131d are categorized as a piezoelectric-drive-circuit group A, each of which is an even-numbered piezoelectric drive circuit counted from the piezoelectric drive circuit (131a) that is closest to the movable portion 120. Among the plurality of piezoelectric drive circuits 132a to 132d of the drive beam 130b, the piezoelectric drive circuits 132a and 132c are categorized as a piezoelectric-drive-circuit group A, each of which is an odd-numbered piezoelectric drive circuit counted from the piezoelectric drive circuit (132a) that is closest to the movable portion 120. As illustrated in FIG. 17B, the piezoelectric drive circuits of the piezoelectric-drive-circuit group A having received the drive voltage applied in parallel (concurrently) deform in a bending manner in the identical direction, so that the movable portion 120 rotates in the -Z direction around the E-axis.

Among the plurality of piezoelectric drive circuits 131a to 131d of the drive beam 130a, the piezoelectric drive circuits 131a and 131c are categorized as a piezoelectric-drive-circuit group B, each of which is an odd-numbered piezoelectric drive circuit counted from the piezoelectric drive circuit (131a) that is closest to the movable portion 120. Among the plurality of piezoelectric drive circuits 132a to 132d of the drive beam 130b, the piezoelectric drive circuits 132b and 132d are categorized as a piezoelectric-drive-circuit group B, each of which is an even-numbered piezoelectric drive circuit counted from the piezoelectric drive circuit (132a) that is closest to the movable portion 120. As illustrated in FIG. 17D, the piezoelectric drive circuits of the piezoelectric-drive-circuit group B having received the drive voltage applied in parallel deform in a bending manner in the identical direction, so that the movable portion 120 rotates in the +Z direction around the E-axis.

As illustrated in FIGS. 17B and 17D, in the drive beam 130a or 130b, the plurality of piezoelectric portions 202 of the piezoelectric-drive-circuit group A or the plurality of piezoelectric portions 202 of the piezoelectric-drive-circuit group B concurrently deform in a bending manner. Thus, the movable amount due to bending deformation is accumulated, thereby increasing the deflection angle of the movable portion 120 around the E-axis.

For example, as illustrated in FIG. 15, the drive beams 130a and 130b are coupled to the movable portion 120 point-symmetrically with respect to the center point of the movable portion 120. Thus, when the drive voltage is applied to the piezoelectric-drive-circuit group A, a drive force of driving in the +Z direction is generated in the drive beam 130a at the coupling portion of the movable portion 120 and the drive beam 130a; and a drive force of driving in the -Z direction is generated in the drive beam 130b at the coupling portion of the movable portion 120 and the drive beam 130b. Thus, the movable amount is accumulated and hence the deflection angle of the movable portion 120 around the E-axis can be increased.

Figure 17C:
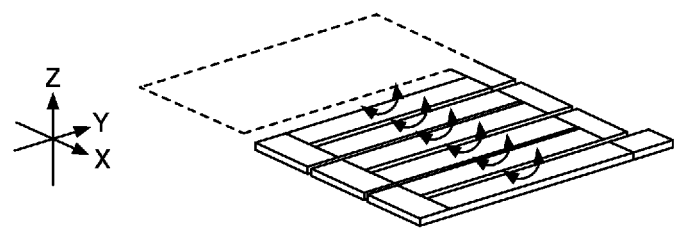
FIG. 17C is a schematic view when the drive beams of the movable device are deformed.
Figure 17D:
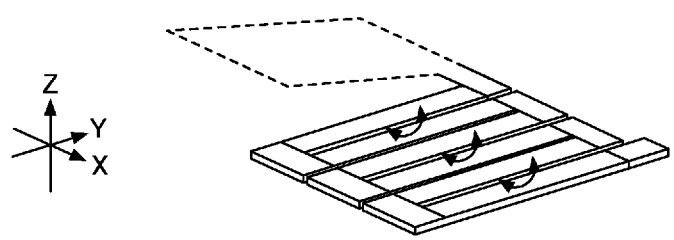
FIG. 17D is a schematic view when the drive beams of the movable device are deformed.

As illustrated in FIG. 17C, the deflection angle is zero when the movable amount of the movable portion 120 by the piezoelectric-drive-circuit group A due to voltage application is in balance with the movable amount of the movable portion 120 by the piezoelectric-drive-circuit group B due to voltage application.

The drive voltage is applied to the piezoelectric drive circuits to continuously repeat the situations in FIGS. 17B to 17D. Thus, the movable portion 120 can be driven around the E-axis.

The drive voltages that are applied to the drive beams are controlled by the control device.

The drive voltage that is applied to the piezoelectric-drive-circuit group A (hereinafter, drive voltage A) and the drive voltage that is applied to the piezoelectric-drive-circuit group B (hereinafter, drive voltage B) are described referring to FIGS. 18A to 18C.

Figure 18A:
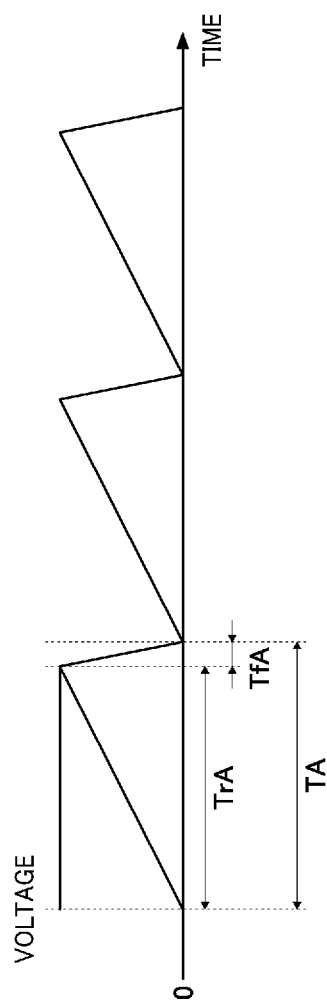
FIG. 18A illustrates an example of the waveform of a drive voltage A that is applied to a piezoelectric-drive-circuit group A of the movable device.

FIG. 18A is an example of the waveform of the drive voltage A that is applied to the piezoelectric-drive-circuit group A of the movable device 13. FIG. 18B is an example of the waveform of the drive voltage B that is applied to the piezoelectric-drive-circuit group B of the movable device. FIG. 18C is a view in which the waveform of the drive voltage A and the waveform of the drive voltage B are superposed on each other.

As illustrated in FIG. 18A, the drive voltage A that is applied to the piezoelectric-drive-circuit group A is in a sawtooth-waveform drive voltage and has a frequency of, for example, 60 Hz. The waveform of the drive voltage A has a preset ratio of TrA:TfA=9:1 where TrA is a time width of a rising duration in which the voltage value increases from a minimum value to a maximum value and TfA is a time width of a falling duration in which the voltage value decreases from the maximum value to a next minimum value. In this case, the ratio of TrA to one cycle is referred to as a symmetry of the drive voltage A.

As illustrated in FIG. 18B, the drive voltage B that is applied to the piezoelectric-drive-circuit group B is in a sawtooth-waveform drive voltage and has a frequency of, for example, 60 Hz. The waveform of the drive voltage B has a preset ratio of TfB:TrB=9:1 where TrB is a time width of a rising duration in which the voltage value increases from a minimum value to a maximum value and TfB is a time width of a falling duration in which the voltage value decreases from the maximum value to a next minimum value. In this configuration, the ratio of TfB to one cycle is referred to as a symmetry of the drive voltage B. As illustrated in FIG. 18C, for example, a cycle TA of the waveform of the drive voltage A and a cycle TB of the waveform of the drive voltage B are set to be equal to each other.

The sawtooth waveforms of the drive voltage A and the drive voltage B are generated by the superposition of sine waves. In the embodiment, the drive voltages in the sawtooth waveforms are used for the drive voltages A and B; however, no limitation is intended thereby. The waveforms can be changed in accordance with the device characteristics of the movable device. The device characteristics include, for example, a drive voltage with a waveform in which a vertex of a sawtooth waveform is rounded, and a drive voltage with a waveform in which a straight line region of a sawtooth waveform is curved.

Before advantageous effects of the movable device according to the embodiment are described, a movable device according to a comparative example is described first.

Figure 19A:
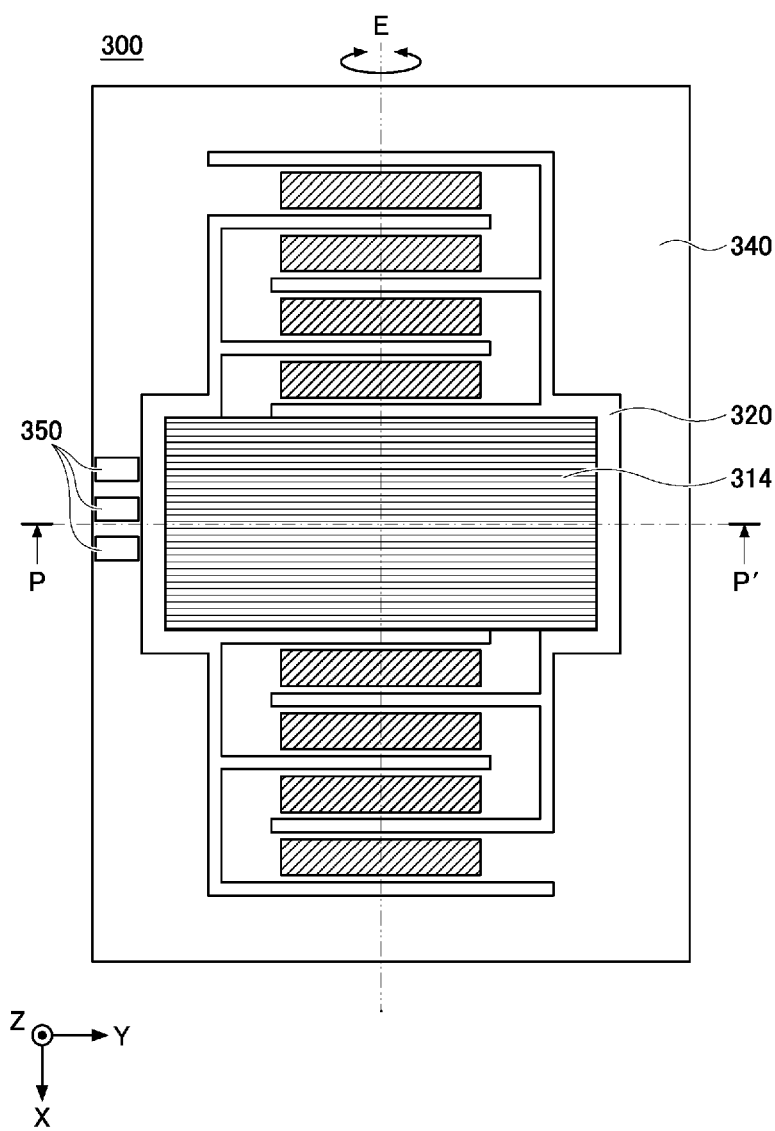
FIG. 19A is a plan view illustrating a configuration of a movable device according to a comparative example.
Figure 19B:
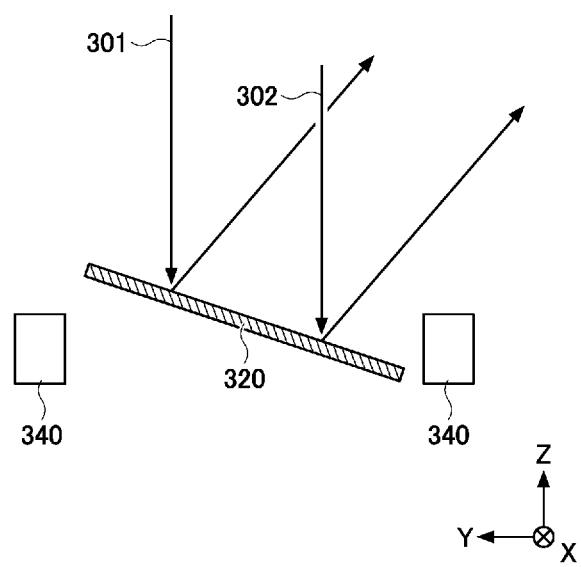
FIG. 19B is a cross-sectional view taken along line P-P' of FIG. 19A when the deflection angle of a movable portion of the movable device is small.
Figure 19C:
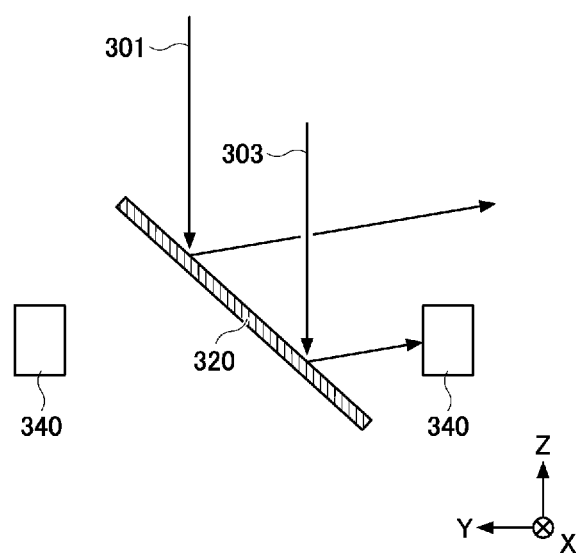
FIG. 19C is a cross-sectional view taken along line P-P' of FIG. 19A when the deflection angle of the movable portion of the movable device is large.

FIGS. 19A to 19C each illustrate a configuration of a movable device according to a comparative example, FIG. 19A being a plan view, FIG. 19B being a cross-sectional view taken along line P-P' of FIG. 19A when the deflection angle of the movable portion is small, FIG. 19C being a cross-sectional view taken along line P-P' of FIG. 19A when the deflection angle of the movable portion is large.

As illustrated in FIG. 19A, a movable device 300 according to a comparative example includes a movable portion 320 including a reflecting surface 314, a support portion 340 that supports the movable portion 320 rotatably around the E-axis, and an electrode connection portion 350.

FIG. 19B illustrates a state in which incident light 301 is incident on the reflecting surface 314 of the movable portion 320 in the −Z direction and is reflected by the reflecting surface 314 of the rotated movable portion 320. In this case, the deflection angle (rotational angle) of the movable portion 320 is small, and hence the support portion 340 located on the +Y side of the movable portion 320 does not block the light reflected by the reflecting surface 314.

FIG. 19C similarly illustrates a state in which incident light 301 is incident on the reflecting surface 314 of the movable portion 320 in the −Z direction and is reflected by the reflecting surface 314 of the rotated movable portion 320. In this case, the deflection angle of the movable portion 320 is large, and hence the support portion 340 located on the +Y side of the movable portion 320 blocks the light reflected by the reflecting surface 314.

In this way, with the movable device 300 according to the comparative example, when the deflection angle of the movable portion 320 is large, the support portion 340 located on either of the ±Y sides of the movable portion 320 blocks the light reflected by the reflecting surface 314. The scanning angle with light by the movable portion 320 is limited, and a large scanning angle is not provided.

In contrast, according to this embodiment, the support portion 140 has the light passing portions 16 and 17 on both sides of the movable portion 120 in the direction intersecting with the E-axis (±Y directions in FIG. 19A) in a plane along the reflecting surface 14 in a state in which the movable portion 120 is not rotated as described above. A member is not present on the ±Y sides of the movable portion 120. Even when the deflection angle of the movable portion 120 increases, the light reflected by the reflecting surface 14 is not blocked. Thus, the scanning angle with light of the movable portion 120 is not limited, and a large scanning angle can be obtained.

Moreover, when the movable device 13 is used in a distance measurement device such as the LiDAR device described above with reference to FIGS. 9 and 10, scanning with laser beams may be provided by the movable device 13 in the horizontal direction, and the laser beams may be spread (diverged) in the vertical direction to detect an object ahead of a vehicle in a two-dimensional plane intersecting with the travel direction of the vehicle. In this case, as the deflection angle of the movable portion 120 increases, the laser beams spread in the X direction parallel to the E-axis may be blocked by the support portion 140 and the divergent angle may be limited.

In contrast, according to this embodiment, as described above with reference to FIG. 15, the light passing portions 16 and 17 have shapes in which the widths of the light passing portions 16 and 17 in a direction along the E-axis are widened in a tapered manner as the widths are farther from the E-axis. Since the light passing portions 16 and 17 have the shapes in which the widths are widened in a tapered manner along the light divergent in the ±X directions, the limitation of the divergent angle of the light in the ±X directions can be relaxed.

Like the movable device 300 illustrated in FIG. 19A, the electrode connection portion 350 may be provided at one edge portion having a long side in a direction along the E-axis of the support portion 340, to apply a drive voltage to the drive beams provided at positions in the ±X directions with the movable portion 320 interposed therebetween. In this case, the edge portion of the support portion 340 provided with the electrode connection portion 350 may block the light reflected by the reflecting surface 314, and the scanning angle with light by the movable portion 320 may be limited.

In contrast, according to this embodiment, the wiring portion 123 that transmits the current or voltage signal applied via the electrode connection portion 150 is provided in a region on the movable portion 120 other than the reflecting surface 14 and on the drive beams 130a and 130b. Thus, even when the electrode connection portion 150 is provided at one edge portion having the long side in a direction intersecting with the E-axis of the support portion 140 (see FIG. 15), a drive voltage can be applied to both the drive beams 130a and 130b provided at positions in the ±X directions with the movable portion 120 interposed therebetween. Since a member such as the support portion is not required to be disposed on the ±Y sides of the movable portion 120, the scanning angle with light of the movable portion 120 is not limited by such a member and a large scanning angle can be obtained.

Providing the wiring portion 123 may cause protrusions and depressions to be formed on the surface of the movable portion 120. When the wiring portion 123 is formed in the region provided with the reflecting surface 14, the light incident on the reflecting surface 14 may be diffused by the protrusions and depressions of the wiring portion 123 and reflection of light by the reflecting surface 14 may be interrupted. According to this embodiment, as illustrated in FIG. 16A, the wiring portion 123 is formed in a region (a region other than the reflecting surface) on the surface of the movable portion 120 near the outer periphery not provided with the reflecting surface 14. Accordingly, interruption of reflection of light at the reflecting surface 14 is avoided. Moreover, according to this embodiment, since the wiring portion 123 is covered with the protection film 124, a short due to adhesion of dust or moisture to a conductor and disconnection due to contact with a member can be prevented from occurring.

Next, modifications of the first embodiment are described. The description on components identical with those in the above-described embodiment may be omitted.

A movable device according to any one of modifications and embodiments which will be described later includes a wiring portion 123 on a movable portion 120, and on drive beams 130a and 130b like the movable device 13 according to the first embodiment; however, these components are not illustrated for the convenience of under-standing the illustration.

According to a first modification, an example is described in which light passing portions have shapes in which the widths of the light passing portions in a direction along the E-axis are non-linearly widened as the widths are farther from the E-axis.

Figure 20:
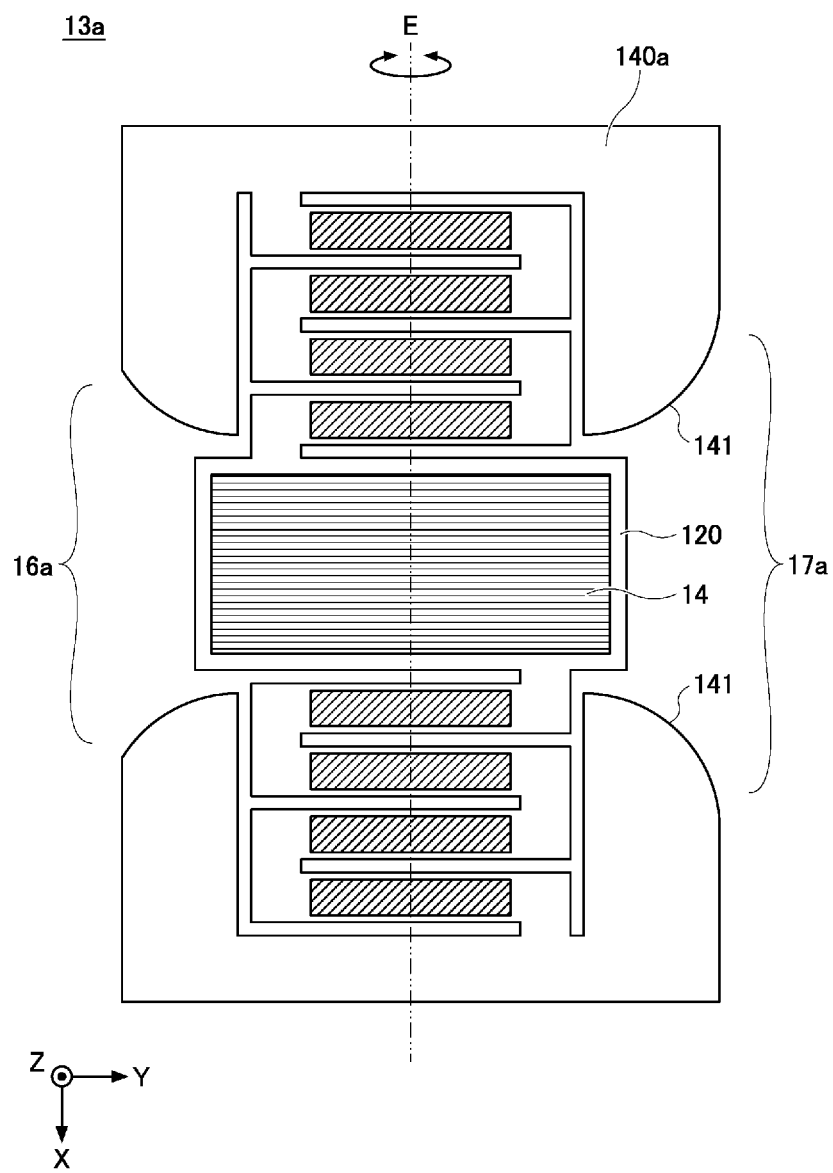
FIG. 20 is a plan view of an example of a configuration of a movable device according to a first modification of the first embodiment.

FIG. 20 is a plan view of an example of a configuration of a movable device 13a according to a first modification. As illustrated in FIG. 20, the movable device 13a includes a support portion 140a having light passing portions 16a and 17a on both sides of the movable portion 120 in the Y direction in FIG. 20 (a direction intersecting with the E-axis in a plane along the reflecting surface 14 in a state in which the movable portion 120 is not rotated).

The light passing portions 16a and 17a have shapes in which the widths of the light passing portions 16a and 17a in a direction along the E-axis are non-linearly widened as the widths are farther from the E-axis. In other words, as illustrated as a curved-surface portion 141 in FIG. 20, the light passing portions 16a and 17a have shapes in which the widths of the light passing portions 16a and 17a in the direction along the E-axis are widened in a curved tapered manner as the widths are farther from the E-axis.

When a movable device is arranged in a device such as a LiDAR device, the movable device is secured to a base of the LiDAR device using an adhesive or the like while a surface of the support portion serves as a portion to be secured. Thus, as the area of the support portion decreases, the contact area between the portion to be secured and the base decreases. The bonding intensity decreases, thereby degrading stability of securing.

When the support portion 140 includes the light passing portions 16 and 17 like the movable device 13 according to the first embodiment, the bonding area of the support portion 140 decreases by the area of the light passing portions 16 and 17.

According to this modification, since the light passing portions 16a and 17a have the shapes in which the widths of the light passing portions 16a and 17a in the direction along the E-axis are non-linearly widened as the widths are farther from the E-axis, the bonding area of the support portion 140 increases by the amount obtained by the non-linear form (curved surface).

Accordingly, when the deflection angle of the movable portion 120 increases, block of reflected light by the support portion 140a can be avoided by the light passing portions 16a and 17a, the bonding area of the support portion 140a to the base can be ensured, and the stability of securing of the movable device 13a can be increased.

Moreover, since the light passing portions 16a and 17a have the shapes that are non-linearly widened as being farther from the E-axis, even when the beam spot shape of laser beams at the reflecting surface 14 has a curved surface or an ellipsoidal shape, block of reflected light by the support portion 140a can be avoided by the light passing portions 16a and 17a, the bonding area of the support portion 140a to the base can be ensured, and the stability of the movable device 13a can be increased.

Figure 21:
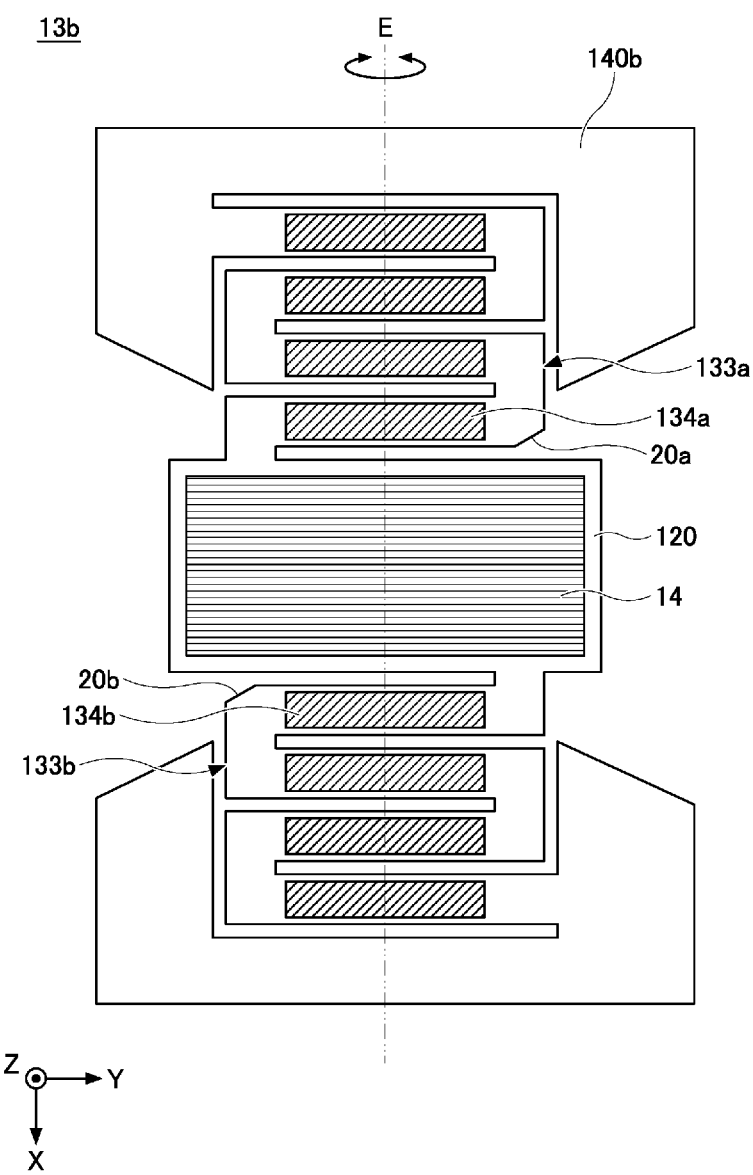
FIG. 21 is a plan view of an example of a configuration of a movable device according to a second modification of the first embodiment.
Figure 22:
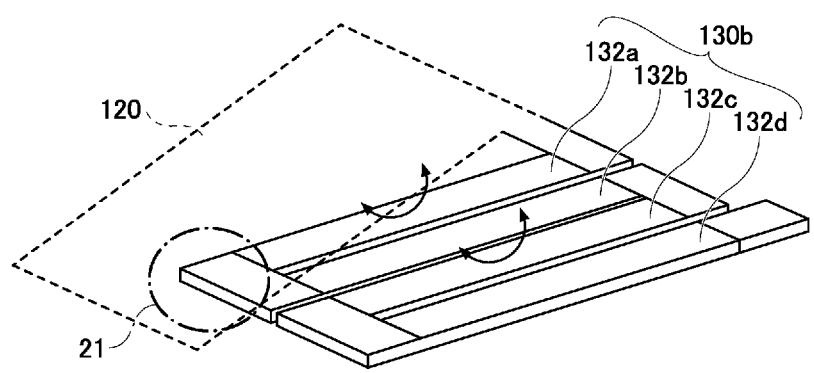
FIG. 22 illustrates a state in which a movable portion rotates in accordance with bending deformation of a drive beam.

FIG. 21 is a plan view of an example of a configuration of a movable device 13b according to a second modification. As illustrated in FIG. 21, the movable device 13b includes a drive beam 133a and a drive beam 133b.

The drive beams 133a and 133b each include a meandering beam (a meandering structure) in which a plurality of piezoelectric drive circuits having long sides in a direction intersecting with the E-axis are coupled at folded portions. Piezoelectric drive circuits 134a and 134b adjacent to the movable portion 120 are coupled to the movable portion 120 at one end sides thereof in the direction intersecting with the E-axis and have cut shapes 20a and 20b that include straight portions on the other end sides thereof in the direction intersecting with the E-axis.

As described above with reference to FIGS. 17A to 17D, FIG. 22 illustrates a state in which the movable portion 120 of the movable device 13 rotates in accordance with bending deformation of the drive beam 130b. When the movable portion 120 is rotated, a portion of the piezoelectric drive circuit 132a that is adjacent to the movable portion 120 and that is coupled to the movable portion 120 moves together with the movable portion 120, whereas a portion that is not coupled to the movable portion 120 may move away from the movable portion 120. In this case, the other end portion 21A located on the side opposite to the one end side of the piezoelectric drive circuit 132*a* coupled to the movable portion 120 moves away from the movable portion 120 by a largest distance. Since the other end portion 21 moves away from the movable portion 120, part of the other end portion 21 may enter the optical path of the light reflected by the reflecting surface 14 of the movable portion 120 and block the reflected light.

According to this modification, such other end portions 21 partly have the cut shapes 20*a* and 20*b*, and hence the other end portions 21 do not block the light reflected by the reflecting surface 14. Thus, the scanning angle with light of the movable portion 120 is not limited, and a large scanning angle can be obtained. The cut shapes 20*a* and 20*b* have the straight portions in FIG. 21; however, cut shapes may include curved-surface portions.

Figure 23:
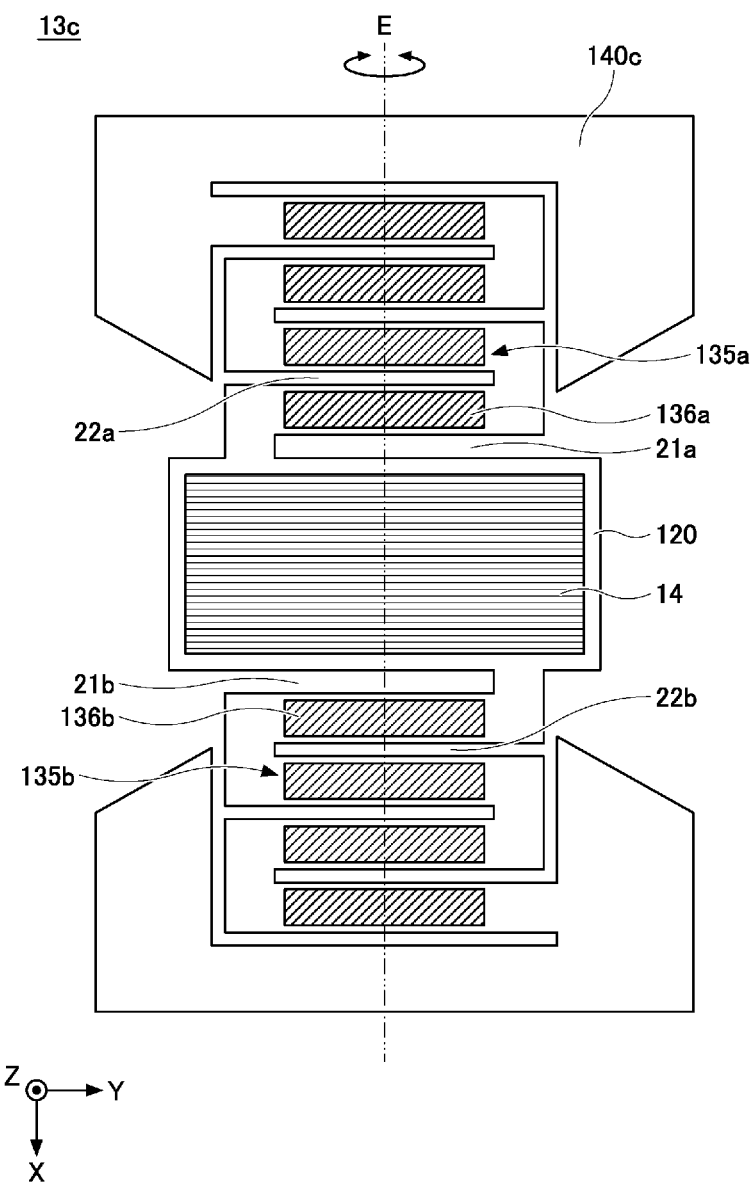
FIG. 23 is a plan view of an example of a configuration of a movable device according to a third modification of the first embodiment.

FIG. 23 is a plan view of an example of a configuration of a movable device 13*c* according to a third modification. As illustrated in FIG. 23, the movable device 13*c* includes a drive beam 135*a* and a drive beam 135*b*.

As illustrated in the second modification, part of the other end portions 21 of the piezoelectric drive circuits adjacent to the movable portion 120 may enter the optical path of the light reflected by the reflecting surface 14 of the movable portion 120 and block the reflected light.

According to this modification, the drive beams 135*a* and 135*b* each include a meandering beam in which a plurality of piezoelectric drive circuits having long sides in a direction intersecting with the E-axis are coupled at folded portions. An interval 21*a* between the movable portion 120 and a piezoelectric drive circuit 136*a* adjacent to the movable portion 120 is larger than an interval 22*a* between adjacent piezoelectric drive circuits. An interval 21*b* between the movable portion 120 and a piezoelectric drive circuit 136*b* adjacent to the movable portion 120 is larger than an interval 22*b* between adjacent piezoelectric drive circuits. Accordingly, part of the other end portions 21 of the piezoelectric drive circuits adjacent to the movable portion 120 do not block the light reflected by the reflecting surface 14 of the movable portion 120. The scanning angle with light of the movable portion 120 is not limited, and a large scanning angle can be obtained. The intervals 22*a* and 22*b* between the adjacent piezoelectric drive circuits are an example of "an interval between beams".

Figure 24:
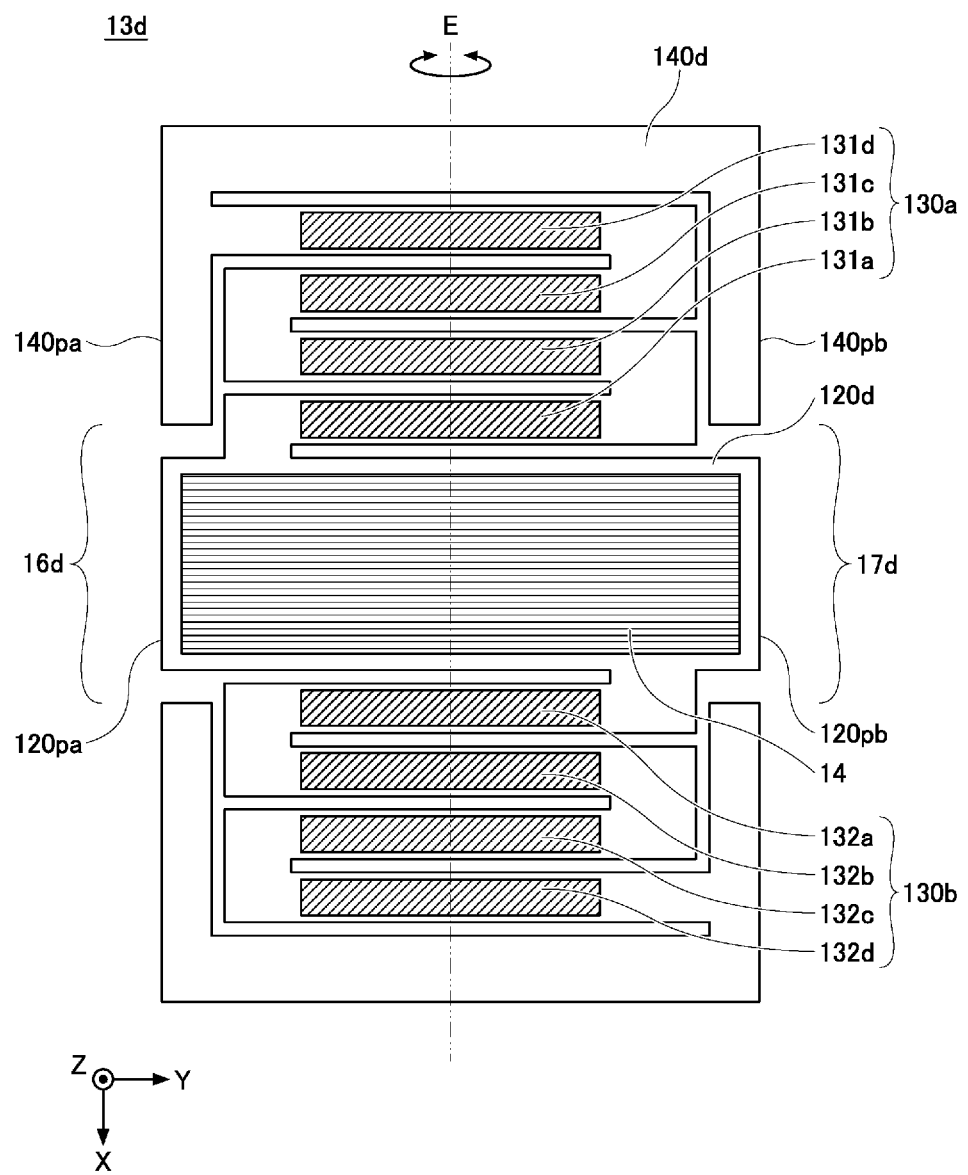
FIG. 24 is a plan view of an example of a configuration of a movable device according to a second embodiment.

Next, a movable device according to a second embodiment is described referring to FIG. 24. The description on components identical with those in the above-described embodiment may be omitted.

FIG. 24 is a plan view of an example of a configuration of a movable device 13*d* according to this embodiment. As illustrated in FIG. 24, the movable device 13*d* includes a support portion 140*d* and a movable portion 120*d*.

The support portion 140*d* includes light passing portions 16*d* and 17*d* on both sides of the movable portion 120*d* in a direction intersecting with the E-axis in a plane along the reflecting surface 14 in a state in which the movable portion 120 is not rotated. The light passing portions 16*d* and 17*d* are formed such that the widths of the light passing portions 16*d* and 17*d* in a direction along the E-axis are larger than the width of the movable portion 120*d* in the direction along the E-axis.

In addition, an outer peripheral surface 120*pa* along the E-axis of the movable portion 120*d* and an outer peripheral surface 140*pa* along the E-axis of the support portion 140*d* are formed in a parallel (flat) state without a step. In other words, the outer peripheral surface 120*pa* and the outer peripheral surface 140*pa* are formed in a state arranged in the same plane.

Similarly, an outer peripheral surface 120*pb* along the E-axis of the movable portion 120*d* and an outer peripheral surface 140*pb* along the E-axis of the support portion 140*d* are formed in a parallel state without a step. In other words, the outer peripheral surface 120*pb* and the outer peripheral surface 140*pb* are formed in a state arranged in the same plane. It is to be noted that "a parallel state without a step" does not represent a state without a step at all, and allows a step that is typically recognizable as a processing tolerance.

The outer peripheral surface 120*pa* is an example of "a first movable-portion outer peripheral surface". The outer peripheral surface 140*pa* is an example of "a first support-portion outer peripheral surface". The outer peripheral surface 120*pb* is an example of "a second movable-portion outer peripheral surface". The outer peripheral surface 140*pb* is an example of "a second support-portion outer peripheral surface".

With this configuration, a member such as a support portion is not present on the ±Y sides of the movable portion 120*d*. Even when the deflection angle of the movable portion 120*d* increases, the light reflected by the reflecting surface 14 is not blocked. Thus, the scanning angle with light of the movable portion 120*d* is not limited, and a large scanning angle can be obtained.

Moreover, the parallel state without a step is an easily processing state for a processing method such as etching. The state can increase processing efficiency and productivity of the movable device 13*d*.

Furthermore, the movable portion 120*d* and the support portion 140 can have the same size in the direction (Y direction) intersecting with the E-axis. The size of the movable portion 13*d* can be decreased, or the size of the reflecting surface 14 can be increased.

Since the size of the movable device 13*d* can be decreased, the degree of freedom for arrangement of the movable device 13*d* can be increased. Moreover, since the material constituting the movable device 13*d* can be decreased, the cost of the movable device 13*d* can be decreased. Furthermore, since the number of movable devices 13*d* that can be manufactured from a single wafer substrate can be increased, productivity can be increased.

Since the size of the reflecting surface 14 can be increased, deviation of incident light from the reflecting surface 14 due to vibration or the like of the movable device 13*d* can be suppressed.

Advantageous effects other than those described above are similar to those described in the first embodiment.

Figure 25:
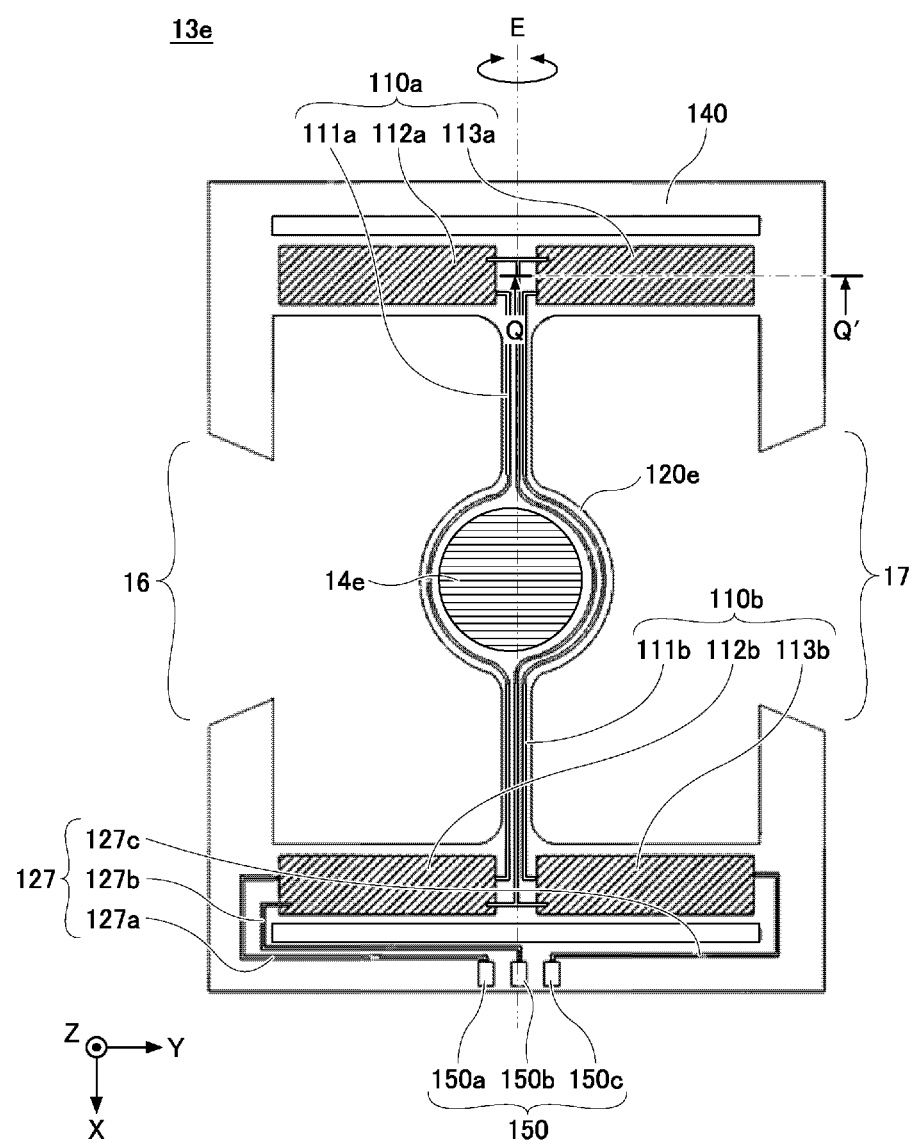
FIG. 25 is a plan view of an example of a configuration of a movable device according to a third embodiment.
Figure 26:
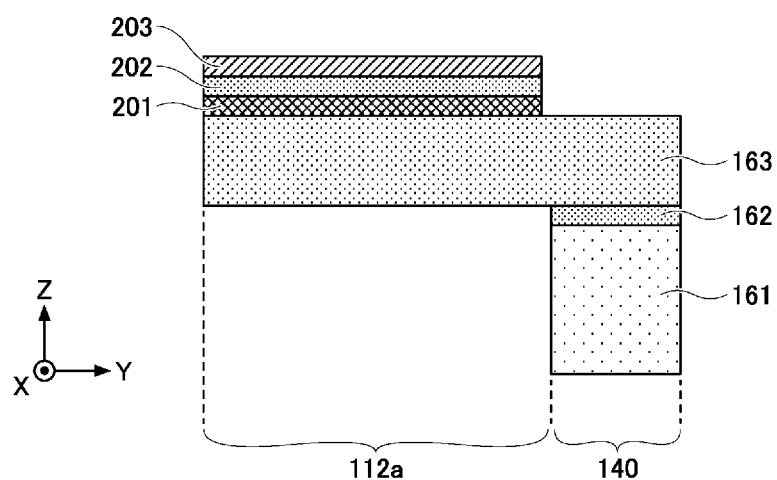
FIG. 26 is a cross-sectional view taken along line Q-Q' in FIG. 25.

Next, a configuration of a movable device 13*e* according to a third embodiment is described referring to FIGS. 25 and 26. FIG. 25 is a plan view of an example of a configuration of the movable device 13*e* according to this embodiment. FIG. 26 is a cross-sectional view taken along line Q-Q' in FIG. 25.

The movable device 13*e* includes a movable portion 120*e* and drive beams 110*a* and 110*b* that drive the movable portion 120*e* around the E-axis parallel to the X-axis. Moreover, a wiring portion 127 that transmits a current or voltage signal applied via the electrode connection portion 150 is provided in a region on the movable portion 120*e* other than a reflecting surface 14*e* and on the drive beams 110*a* and 110*b*. In this case, the drive beams 110*a* and 110*b* are an example of "a pair of drive beams".

The movable portion 120*e* includes, for example, a base body and the reflecting surface 14*e* on the +Z surface of the base body. The base body includes, for example, the silicon active layer 163. The reflecting surface 14*e* includes a metal thin film containing, for example, aluminum (Al), gold (Au), or silver (Ag). The movable portion 120e may have a reinforcing rib on the −Z surface of the base body for the reflecting surface 14e. Such a rib includes, for example, the silicon support layer 161 and the silicon oxide layer 162, serving to prevent the distortion of the reflecting surface 14e due to the motion. While the reflecting surface 14e has a circular shape, the reflecting surface 14e may have another shape, such as an ellipse or a rectangle.

The drive beams 110a and 110b include two torsion bars 111a and 111b that have one ends coupled to the movable portion 120e, that extend in the E-axis direction, and that rotatably support the movable portion 120e; piezoelectric drive circuits 112a and 113a that have one ends on the +X side coupled to the torsion bar 111a and the other ends coupled to an inner peripheral portion of the support portion 140; and piezoelectric drive circuits 112b and 113b that have one ends on the −X side coupled to the torsion bar 111b and the other ends coupled to an inner peripheral portion of the support portion 140.

The torsion bars 111a and 111b include, for example, the silicon active layer 163. The piezoelectric drive circuits 112a, 113a, 112b, and 113b each include the lower electrode 201, the piezoelectric portion 202, and the upper electrode 203 that are formed in that order on the +Z surface of the silicon active layer 163 that serves as an elastic member.

Each of the upper electrode 203 and the lower electrode 201 is made of, for example, gold (Au) or platinum (Pt). For example, the piezoelectric portion 202 is made of lead zirconate titanate (PZT), which is a piezoelectric material.

Although this embodiment has illustrated an example in which the piezoelectric portion 202 is formed on only one surface (+Z surface) of the silicon active layer 163 serving as the elastic member, the piezoelectric portion 202 may be formed on another surface (for example, −Z surface) of the elastic member, or on both the one surface and the other surface of the elastic member.

The shapes of the components are not limited to the shapes in the embodiment as long as the movable portion 120e can be driven around the E-axis. The torsion bars 111a and 111b, and the piezoelectric drive circuits 112a, 113a, 112b, and 113b may have shapes with curvatures.

The wiring portion 127 includes a positive voltage wiring portion 127a to which a positive voltage signal is applied, a GND wiring portion 127b coupled to the GND, and a negative voltage wiring portion 127c to which a negative voltage signal is applied. The positive voltage wiring portion 127a is coupled to the positive electrode connection portion 150a. The GND wiring portion 127b is coupled to the GND connection portion 150b. The negative voltage wiring portion 127c is coupled to the negative electrode connection portion 150c.

More specifically, the GND wiring portion 127b is coupled to the upper electrode 203 of each of the piezoelectric drive circuits 112a, 113a, 112b, and 113b. Moreover, the positive voltage wiring portion 127a is coupled to the lower electrode 201 of each of the piezoelectric drive circuits 112a and 112b, transmits a positive voltage signal thereto, and applies a positive drive voltage thereto.

The negative voltage wiring portion 127c is coupled to the lower electrode 201 of each of the piezoelectric drive circuits 113a and 113b, transmits a negative voltage signal thereto, and applies a negative drive voltage thereto.

In this way, the wiring portion 127 can transmit a voltage signal applied through the electrode connection portion 150 to the piezoelectric drive circuits 112a, 113a, 112b, and 113b, and can apply a drive voltage. Alternatively, the wiring portion 127 may transmit a current signal instead of the voltage signal.

The motion and so forth of the piezoelectric drive circuit by application of a drive voltage is similar to that of the drive beams 130a and 130b which has been described above.

According to this embodiment, the support portion 140 has the light passing portions 16 and 17 on both sides of the movable portion 120e in a direction intersecting with the E-axis (±Y directions in FIG. 25) in a plane along the reflecting surface 14e in a state in which the movable portion 120e is not rotated. A member is not present on the ±Y sides of the movable portion 120e. Even when the deflection angle of the movable portion 120e increases, the light reflected by the reflecting surface 14e is not blocked. Thus, the scanning angle with light of the movable portion 120e is not limited, and a large scanning angle can be obtained.

Advantageous effects by the light passing portions 16 and 17, the electrode connection portion 150, and the wiring portion 127 are similar to those described in the first embodiment.

Fourth Embodiment

Figure 27:
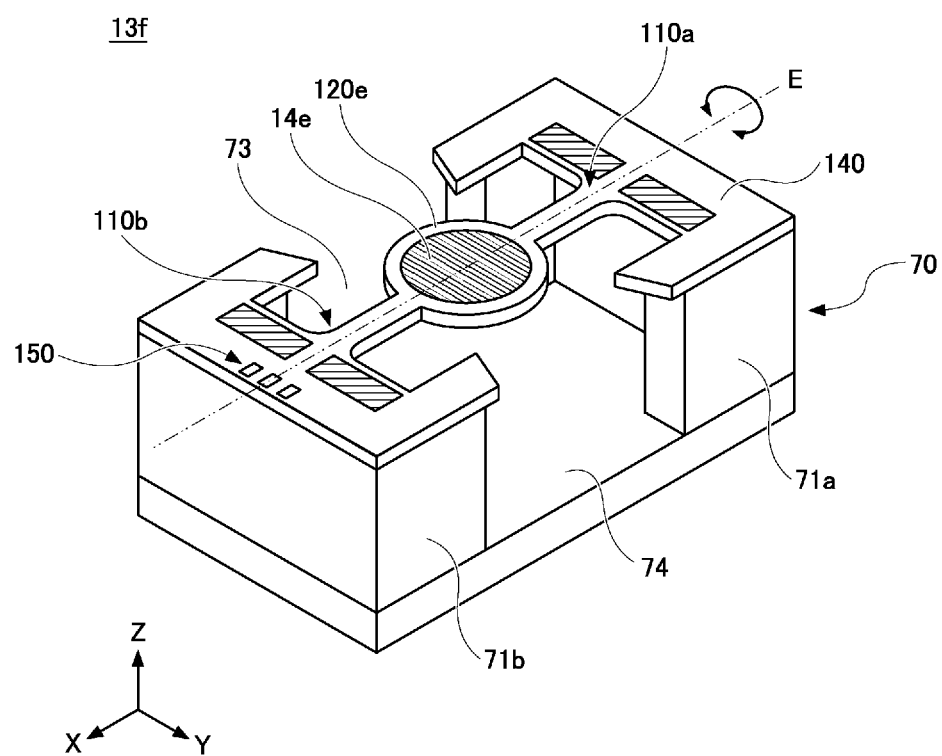
FIG. 27 is a perspective view of an example of a configuration of a movable device according to a fourth embodiment.

Next, a movable device 13f according to a fourth embodiment is described referring to FIGS. 27 to 32. First, FIG. 27 is a perspective view of an example of a configuration of the movable device 13f according to this embodiment.

As illustrated in FIG. 27, the movable device 13f includes a mount portion 70, and the movable portion 13e according to the third embodiment is secured to the +Z surface of the mount portion 70. However, any one of the movable devices 13, 13a, 13b, 13c, and 13d described according to the above embodiments may be secured to the +Z surface of the mount portion 70, and thus the movable device 13f may be configured. In the following description, it is assumed that the movable device 13f includes the movable device 13e as part of the configuration. The movable device 13e secured to the mount portion 70 is an example of "a variable deflector".

Figure 28:
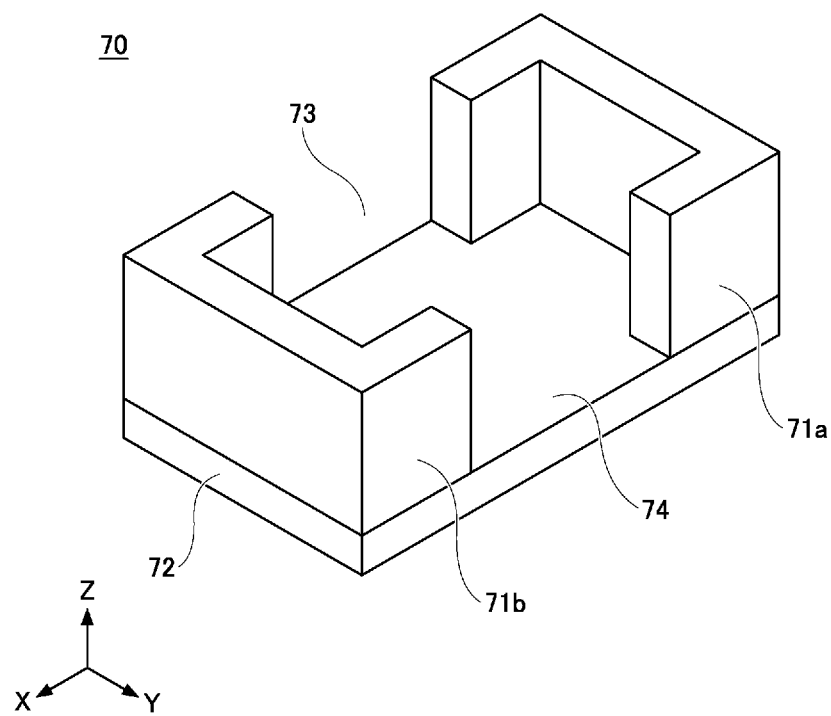
FIG. 28 is a perspective view of an example of a configuration of a mount portion according to a fourth embodiment.

FIG. 28 is a perspective view of an example of a configuration of the mount portion 70. As illustrated in FIG. 28, the mount portion 70 includes side wall members 71a and 71b, and a bottom member 72. The mount portion 70 is an example of "a mount".

The side wall member 71a is a member having an angular C-shaped section that is orthogonal to the Z-axis. The side wall member 71a is secured by bonding or the like to the +Z surface of the bottom member 72 that is a plate-shaped member such that the open side of the angular C shape faces the +X direction. Similarly, the side wall member 71b is a member having an angular C-shaped section that is orthogonal to the Z-axis. The side wall member 71b is secured by bonding or the like to the +Z surface of the bottom member 72 such that the open side of the angular C shape faces the −X direction.

The side wall members 71a and 71b, and the bottom member 72 may be an integrated member. When a metal-based material is used, such a member can be fabricated by, for example, casting, cutting, or metal injection molding. When a resin-based material is used, such a member can be fabricated by, for example, injection molding or using a 3D printer.

The +Z surfaces of the side wall members 71a and 71b can secure the support portion 140 of the movable device 13e. In this case, the +Z surfaces of the side wall members 71a and 71b are an example of "one end surface", and the −Z surfaces of the side wall members 71a and 71b are an example of "the other end surface".

The side wall member 71a and the side wall member 71b are disposed at an interval in the X direction. Thus, a light passing portion 73 is formed on the −Y side of the mount portion 70, and a light passing portion 74 is formed on the +Y side of the mount portion 70. The light passing portions 73 and 74 are an example of a light passing portion that opens part of side wall members constituted of the side wall members 71a and 71b.

Figure 29:
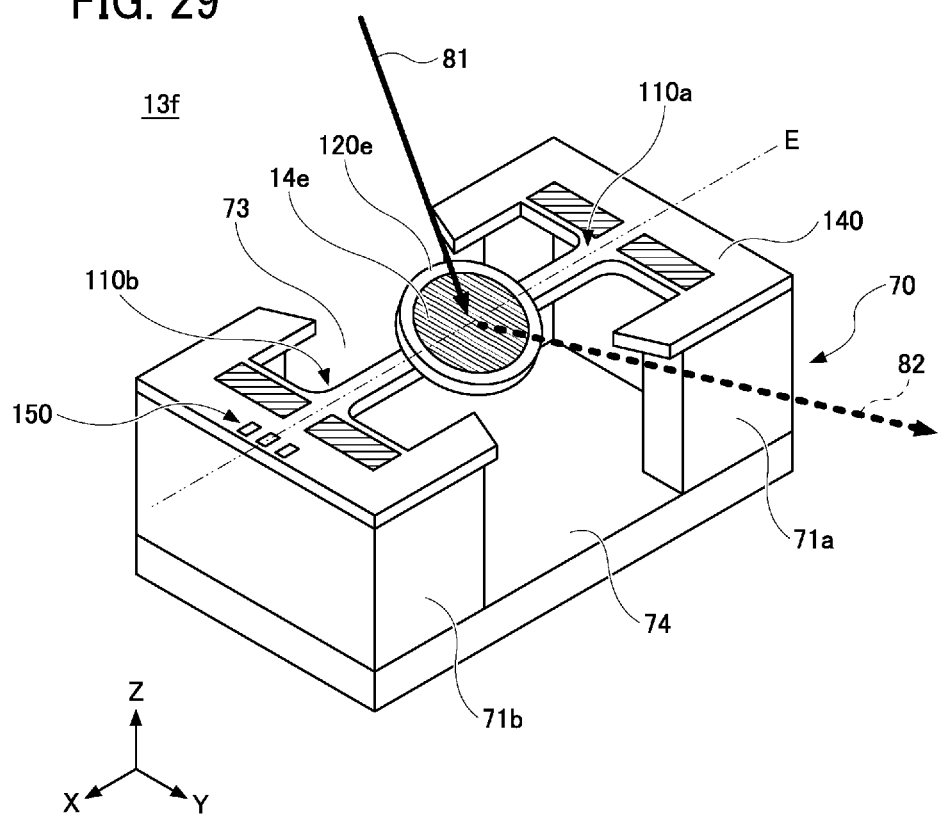
FIG. 29 illustrates an example of a state in which a movable portion rotates.

FIG. 29 illustrates an example of a state in which the movable portion 120e rotates (is driven). Referring to FIG. 29, the movable device 13e is secured to the +Z surfaces of the side wall members 71a and 71b. The movable portion 120e of the movable device 13e rotates around the E-axis, receives the light incident on the reflecting surface 14e in the direction indicated by a thick-solid-line arrow 81, and reflects the light in a direction indicated by a thick-broken-line arrow 82.

Since the light passing portions 73 and 74 are formed on the ±Y sides of the mount portion 70, as illustrated in FIG. 29, a member that blocks the light reflected by the reflecting surface 14e is not present on the ±Y sides of the movable portion 120e. Accordingly, a space that allows the light reflected by the reflecting surface 14e to pass therethrough can be ensured. Moreover, since the support portion 140 is secured at the +Z surfaces of the side wall members 71a and 71b, a space that allows the light reflected by the reflecting surface 14e to pass therethrough at an angle in a predetermined angular range can be ensured also on the −Z side of the movable portion 120e.

The light passing portions 73 and 74 allow the light reflected by the reflecting surface 14e to pass therethrough even when the movable portion 120e is largely rotated. To allow the light reflected by the reflecting surface 14e to pass, the light passing portions 73 and 74 desirably have widths in the X direction larger than the width of the reflecting surface 14e in the X direction.

While the angular C-shaped members are used as an example of the side wall members 71a and 71b, it is not limited thereto. As far as the light passing portions 73 and 74 are formed, at least one of the side wall members 71a and 71b may use a flat-plate-shaped member.

Next, a manufacturing method of the movable device 13f is described referring to FIGS. 30 and 31A to 31D.

Figure 30:
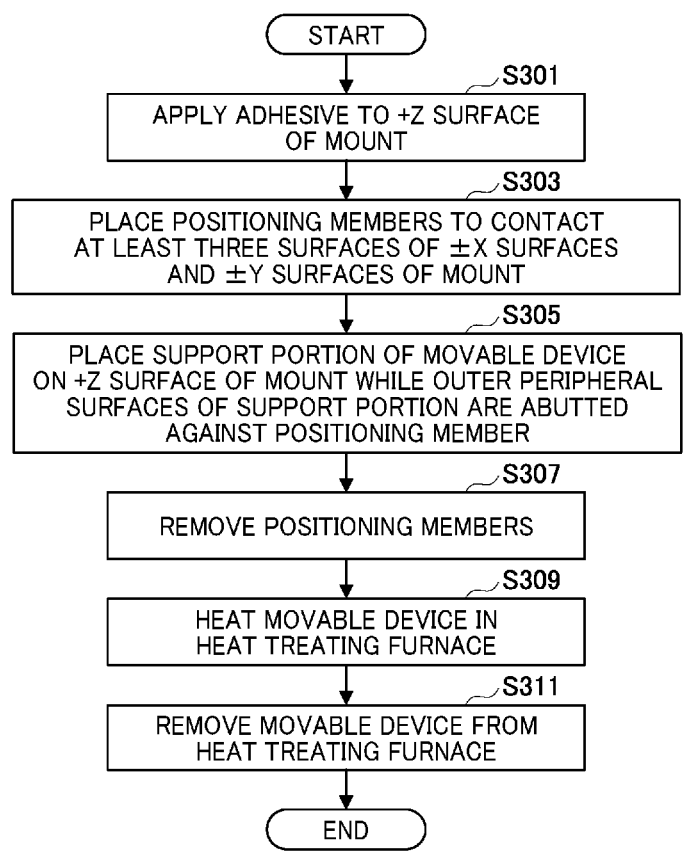
FIG. 30 is a flowchart of an example of a manufacturing method of a movable device according to a fourth embodiment.
Figure 31A:
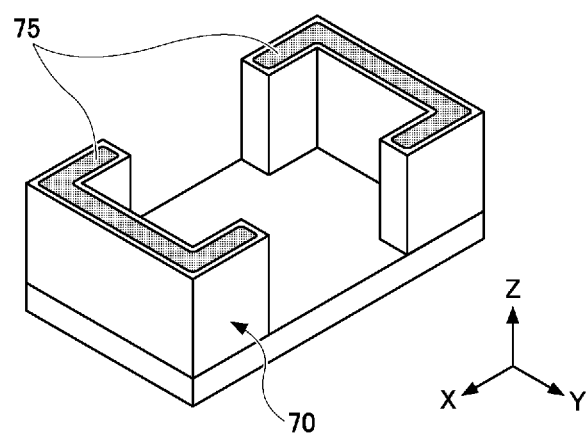
FIG. 31A is a perspective view of the example of the manufacturing method of the movable device according to the fourth embodiment, FIG. 31A illustrating an adhesive application step.
Figure 31B:
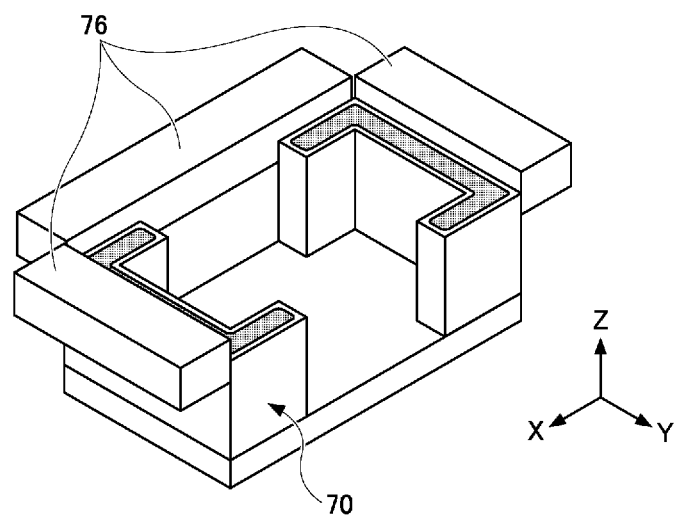
FIG. 31B is a perspective view of the example of the manufacturing method, FIG. 31B illustrating a positioning member placement step.
Figure 31C:
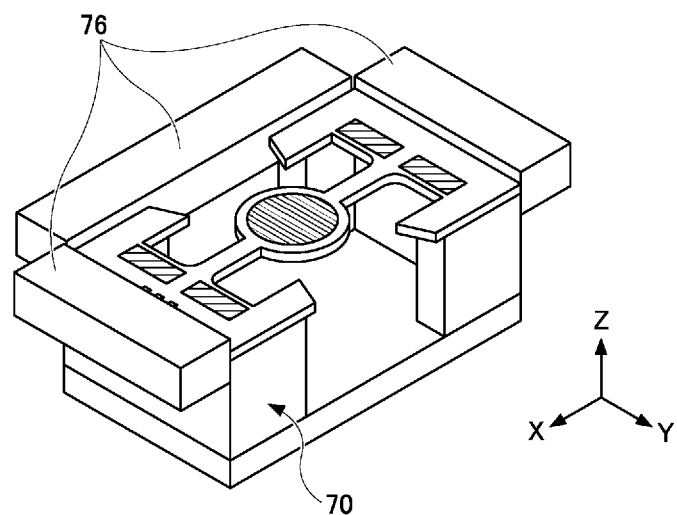
FIG. 31C is a perspective view of the example of the manufacturing method, FIG. 31C illustrating a securing step of a support portion to the mount portion.
Figure 31D:
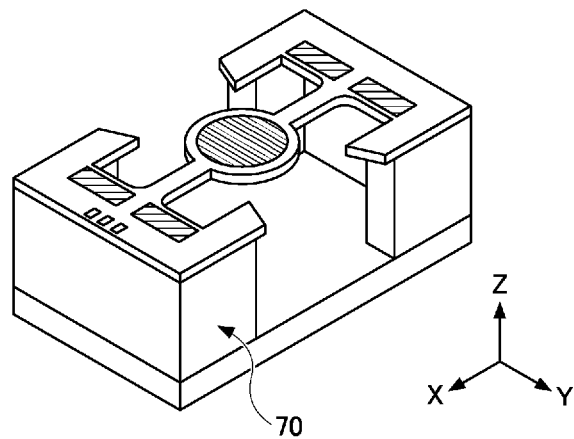
FIG. 31D is a perspective view of the example of the manufacturing method, FIG. 31D illustrating the movable device after the manufacturing step is ended.

FIG. 30 is a flowchart of an example of a manufacturing method of the movable device 13f. FIGS. 31A to 31D are perspective views of the example of the manufacturing method of the movable device 13f according to the fourth embodiment, FIG. 31A illustrating an adhesive application step, FIG. 31B illustrating a positioning member placement step, FIG. 31C illustrating a securing step of the movable device 13e to the mount portion, FIG. 31D illustrating the movable device after the manufacturing step is ended. In the description with reference to FIGS. 30 and 31, it is assumed that the mount portion 70 is already assembled, and the movable device 13e that is secured to the mount portion 70 is already treated by etching on an MN substrate or the like as described above.

Referring to FIG. 30, first in step S301, an adhesive 75 is applied to the +Z surfaces of the mount portion 70 (the side wall members 71a and 71b) (see FIG. 31A). Examples of the adhesive 75 include conductive metal paste such as silver paste; and a thermosetting adhesive, such as an epoxy-resin-based adhesive or a silicone-resin-based adhesive. It is to be noted that silicone is a compound obtained by reducing silicon dioxide to make silicon and then bonding an organic compound, and hence having both organic and inorganic characteristics.

Then, in step S303, positioning members 76 are placed to come into contact with at least three surfaces of the ±X surfaces and the ±Y surfaces of the mount portion 70. In this case, as illustrated in FIG. 31B, portions of surfaces in the Z direction of the positioning members 76 are brought into contact with the surfaces of the side wall members 71a and 71b of the mount portion 70, whereas the other portions of the surfaces in the Z direction of the positioning members 76 remain in a state not in contact with the surfaces of the side wall members 71a and 71b of the mount portion 70 so that the outer peripheral surfaces of the support portion 140 of the movable device 13e can be abutted against the other portions. To adjust the height in the Z direction of the positioning members 76, a block member or the like that determines the height in the Z direction may be prepared, and the positioning member 76 may be placed on the bock member.

Referring back to FIG. 30, and the description is continued.

In step S305, while the outer peripheral surfaces of the support portion 140 of the movable device 13e are abutted against the surfaces of the positioning member 76, the support portion 140 is placed on the +Z surface of the mount portion 70 (see FIG. 31C). Accordingly, the movable device 13f becomes a temporarily arranged state.

In step S307, the positioning members 76 are removed.

In step S309, the movable device 13f in the temporarily arranged state is put in a heat treating furnace, and is heated. Accordingly, the support portion 140 of the movable device 13e is bonded to the +Z surface of the mount portion 70, and is secured.

In step S311, the movable device 13f is removed from the heat treating furnace.

Thus, the movable device 13f can be manufactured.

As described above, according to this embodiment, since the light passing portions 73 and 74 are provided on the ±Y sides of the mount portion 70, a member that blocks the light reflected by the reflecting surface 14e is not present on the ±Y sides and the −Z side in a predetermined angular range of the movable portion 120e. Thus, even when the deflection angle of the movable portion 120e increases, the light reflected by the reflecting surface 14 is not blocked, the light scanning angle of the movable portion 120e is not limited, and a large scanning angle can be obtained. For example, when it is assumed that the range from the −Y direction to the +Y direction in FIG. 29 is the angular range of 180 degrees of the scanning angle with the light reflected by the reflecting surface 14e, a scanning angle of 180 degrees or larger can be provided according to this embodiment.

When the movable device 13f is manufactured or used, the movable device 13e included in the movable device 13f may expand or contract in the X direction due to a change in ambient temperature of the movable device 13f. Moreover, the bottom member 72 of the mount portion 70 may expand or contract in the X direction due to a change in ambient temperature. In this case, if there is a difference in expansion coefficient or contraction coefficient between the movable device 13e and the bottom member 72, a stress is generated at a position at which both members are bonded, and a desirable rotation of the movable portion 120e may not be obtained.

In contrast, according to this embodiment, the bottom member 72 is made of the same material as the material of the support portion 140, the movable portion 120e, and the drive beams 110a and 110b of the movable device 13e, or a material having a thermal expansion coefficient similar to that of the material. Accordingly, the difference in expansion coefficient or contraction coefficient in the X direction among the support portion 140, the movable portion 120e, the drive beams 110a and 110b, and the bottom member 72 due to a change in ambient temperature of the movable device 13f can be reduced, and the movable portion 120e can be desirably rotated.

Specifically, since the support portion 140, the movable portion 120e, and the drive beams 110a and 110b of the movable device 13e are made of Si as a material as described above, the bottom member 72 is desirably made of the same material of Si or TEMPAX (registered trademark) glass as a material with a thermal expansion coefficient similar to that of Si.

The entirety of the mount portion 70 may be made of a material having a small thermal expansion coefficient. Specifically, a material having a linear thermal expansion coefficient of from 0.0 to 5.0 ($10^{-6}$/K) in a temperature range of from 293K (kelvin) to 2473K is desirably used. When the side wall members 71a and 71b and the bottom member 72 are integrally formed, for example, silicon or TEMPAX glass may be cut to fabricate a member in which the side wall members 71a and 71b and the bottom member 72 are integrated. Alternatively, a metal (Invar or the like) having a small thermal expansion coefficient may be processed by casting or cutting to fabricate a member in which the side wall members 71a and 71b and the bottom member 72 are integrated.

Figure 32:
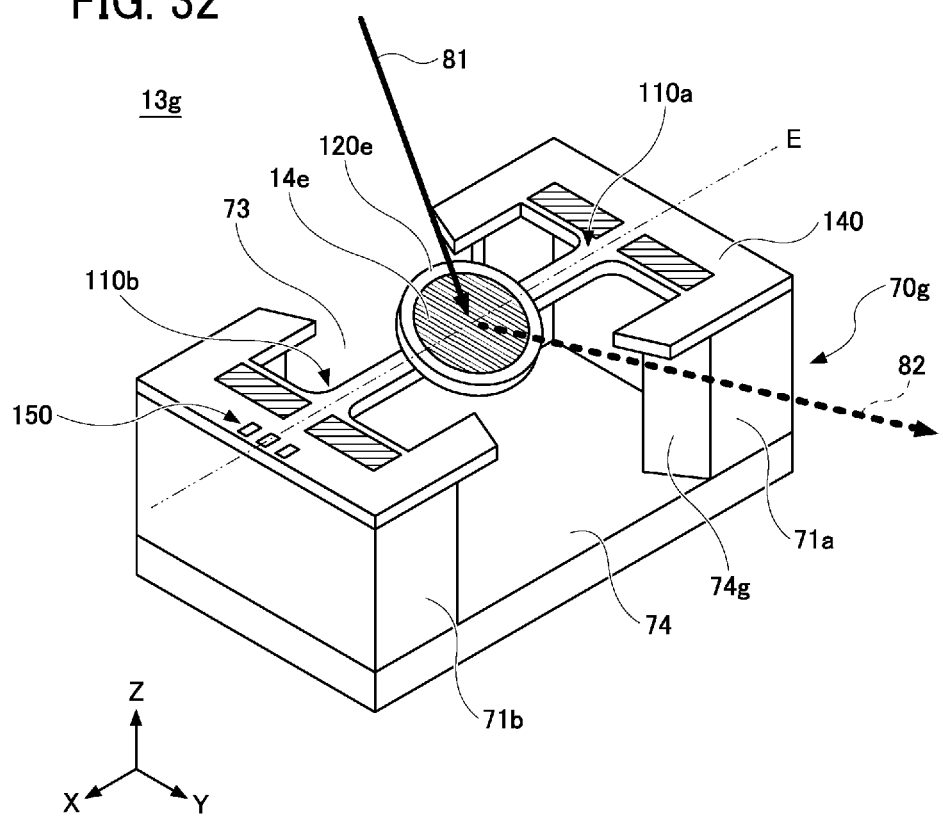
FIG. 32 illustrates an example of a movable device according to a modification of the fourth embodiment.

FIG. 32 illustrates an example of a movable device 13g according to a modification of the fourth embodiment.

In the movable device 13g, an inclined surface 74g is formed at a surface of the side wall member 71a that forms the light passing portion 74. The inclined surface 74g is formed such that the width of the light passing portion 74 in the X-axis direction is widened as the width of the light passing portion 74 is farther from the E-axis.

Similarly, a surface of the side wall member 71b that forms the light passing portion 74, a surface of the side wall member 71a that forms the light passing portion 73, and a surface of the side wall member 71b that forms the light passing portion 73 are provided with inclined surfaces.

With this configuration, the mount portion does not block the light reflected by the reflecting surface 14e and being divergent in the ±X directions, hence the divergent angle is not limited, and a large scanning angle can be obtained.

Furthermore, the light passing portions 16 and 17 described according to any one of the first to third embodiments may be coupled by or filled with a translucent optical material, such as glass or a transparent resin material. Thus, the light reflected by the reflecting surface 14e is not blocked and a large scanning angle can be obtained. In any one of the first to third embodiments, a decrease in rigidity of the movable device due to the light passing portions 16 and 17 is suppressed, and a change in positional relationship, such as a distance between the support portions 140, which are separated from each other by the light passing portions 16 and 17 and face each other, can be prevented from occurring. Thus, in a packaging step of bonding a movable device to a package member, the movable device can be easily handled.

Furthermore, the light passing portions 73 and 74 described according to the fourth embodiment may be coupled by or filled with a translucent optical material, such as glass or a transparent resin material. Thus, the light reflected by the reflecting surface 14e is not blocked and a large scanning angle can be obtained. A decrease in rigidity of the movable device due to the light passing portions 73 and 74 is suppressed, and a change in positional relationship, such as a distance between the side wall members 71a and 71b, which are separated from each other by the light passing portions 73 and 74 and face each other, can be prevented from occurring. Thus, in a packaging step of bonding a movable device to a package member, the movable device can be easily handled.

Although the embodiments of the present disclosure have been described above, the present disclosure is not limited to such specific embodiments, and various modifications and changes can be made without departing from the spirit and scope of the present disclosure as set forth in the appended claims.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

This patent application is based on and claims priority pursuant to 35 U.S.C. § 119(a) to Japanese Patent Application No. 2018-237762, filed on Dec. 19, 2018 and Japanese Patent Application No. 2018-237763, filed on Dec. 19, 2018, in the Japan Patent Office, the entire disclosure of which is hereby incorporated by reference herein.

REFERENCE SIGNS LIST

10 Optical scanning system
11 Control device
12, 12b Light source device
13, 13a, 13b, 13c, 13d, 13e, 13f, 13g Movable device
14, 14e Reflecting surface
15 Target surface
16, 16a, 17, 17a Light passing portion
20a, 20b Cut shape
21a, 21b Interval between movable portion and piezoelectric drive circuit adjacent to movable portion
22a, 22b Interval between piezoelectric drive circuits disposed next to each other (example of interval between beams)
25 Light-source driver
26 Movable-device driver
30 Controller
31 Drive-signal output unit
50 Laser headlamp
51 Minor
52 Transparent plate
60 Head-mounted display
60a Front
60b Temple
61 Light guide plate
62 Half mirror
63 Wearer
70, 70g Mount portion (example of mount)
71a, 71b Side wall member
72 Bottom member
73, 74 Light passing portion
74g Inclined surface
75 Adhesive
76 Positioning member
110a, 110b Drive beam (example of pair of drive beams)
111a, 111b Torsion bar
112a, 112b, 113a, 113b Piezoelectric drive circuit
120, 120d, 120e Movable portion 120*pa*, 120*pb* Outer peripheral surface along rotation axis of movable portion
121 Silicon active layer
122 Interlayer insulating film
123, 127 Wiring portion
124 Protection film
125 BOX layer
126 Silicon support layer
130*a*, 130*b* Drive beam (example of pair of drive beams)
134*a*, 134*b* Piezoelectric drive circuit adjacent to movable portion
140, 140*a*, 140*d* Support portion
140*pa*, 140*pb* Outer peripheral surface along rotation axis of support portion
141 Curved-surface portion
150 Electrode connection portion
161 Silicon support layer
162 Silicon oxide layer
163 Silicon active layer
201 Lower electrode
202 Piezoelectric portion
203 Upper electrode
204 Interlayer insulating film
400 Automobile (example of vehicle)
500 Head-up display (example of image projection apparatus)
650 Laser printer
700 LiDAR device (example of distance measurement device)
701 Automobile (example of vehicle)
702 Object
801 Package member
802 Mounting member
803 E-axis of transmissive member (example of rotation axis)

The invention claimed is:

1. A movable device comprising:
a movable portion including a reflecting surface;
a pair of drive beams to support the movable portion rotatably around a predetermined rotation axis with the movable portion disposed between the pair of drive beams; and
a support to support the pair of drive beams,
wherein the support has a light passing portion on each of both sides of the movable portion in a direction intersecting with the rotation axis in a plane along the reflecting surface in a state in which the movable portion is not rotated, the light passing portion to allow light reflected by the reflecting surface to pass through the light passing portion, and
wherein a wiring portion to transmit a current or voltage signal applied via an electrode connection is in a region on the movable portion other than the reflecting surface and on each of the pair of drive beams.

2. A movable device comprising:
a movable portion including a reflecting surface;
a pair of drive beams to support the movable portion rotatably around a predetermined rotation axis with the movable portion disposed between the pair of drive beams; and
a support to support the pair of drive beams,
wherein the support has a light passing portion on each of both sides of the movable portion in a direction intersecting with the rotation axis in a plane along the reflecting surface in a state in which the movable portion is not rotated, the light passing portion to allow light reflected by the reflecting surface to pass through the light passing portion,
wherein a width of the light passing portion in a direction along the rotation axis is larger than a width of the movable portion in the direction along the rotation axis,
wherein a first movable-portion outer peripheral surface of the movable portion along a direction of the rotation axis and a first support-portion outer peripheral surface of the support along the direction of the rotation axis are formed in a parallel state without a step,
wherein a second movable-portion outer peripheral surface, different from the first movable-portion outer peripheral surface, of the movable portion along the direction of the rotation axis and a second support-portion outer peripheral surface, different from the first support-portion outer peripheral surface, of the support along the direction of the rotation axis are formed in a parallel state without a step, and
wherein a wiring portion to transmit a current or voltage signal applied via an electrode connection is in a region on the movable portion other than the reflecting surface and on each of the pair of drive beams.

3. The movable device according to claim 1, wherein the light passing portion has a shape in which a width of the light passing portion in a direction along the rotation axis is widened as the width is farther from the rotation axis.

4. The movable device according to claim 1, wherein the light passing portion has a shape in which a width of the light passing portion in a direction along the rotation axis is non-linearly widened as the width is farther from the rotation axis.

5. The movable device according to claim 1, wherein the wiring portion is covered with a protection film.

6. The movable device according to claim 1,
wherein each of the pair of drive beams includes a meandering beam in which a plurality of beam portions having long sides in the direction intersecting with the rotation axis are coupled at a folded portion, and
wherein the beam portion adjacent to the movable portion is coupled to the movable portion at one end side in the direction intersecting with the rotation axis and has a cut shape having at least one of a straight portion and a curved-surface portion on the other end side in the direction intersecting with the rotation axis.

7. The movable device according to claim 1,
wherein each of the pair of drive beams includes a meandering beam in which a plurality of beam portions having long sides in the direction intersecting with the rotation axis are coupled at a folded portion, and
wherein an interval between the movable portion and the beam portion adjacent to the movable portion is larger than an interval between the beam portions adjacent to each other.

8. A distance measurement device comprising:
the movable device according to claim 1.

9. An image projection apparatus, comprising:
the movable device according to claim 1.

10. A vehicle, comprising:
the distance measurement device according to claim 9.

11. A movable device comprising:
a movable portion including a reflecting surface;
a pair of drive beams to support the movable portion rotatably around a predetermined rotation axis with the movable portion interposed between the pair of drive beams;
a support to support the pair of drive beams; and a mount portion including a side wall member to which the support is secured,
wherein the side wall member on each of both sides of the movable portion in a direction intersecting with the rotation axis has a light passing portion in a plane along the reflecting surface in a state in which the movable portion is not rotated, the light passing portion being to allow light reflected by the reflecting surface to pass though the light passing portion, and
wherein a wiring portion to transmit a current or voltage signal applied via an electrode connection is in a region on the movable portion other than the reflecting surface and on each of the pair of drive beams.

12. The movable device according to claim 11, wherein the light passing portion has a shape in which a width of the light passing portion in a direction along the rotation axis is widened as the width is farther from the rotation axis.

13. The movable device according to claim 11, wherein the mount portion includes a bottom member that is made of a material different from a material of the side wall member and to which the side wall member is secured at an other end surface of the side wall member.

14. The movable device according to claim 11,
wherein a material of the movable portion, the pair of drive beams, and the support includes silicon, and
wherein the mount portion includes a bottom member that is made of silicon or TEMPAX glass and to which the side wall member is secured at an other end surface of the side wall member.

15. A distance measurement device, comprising:
the movable device according to claim 12.

16. An image projection apparatus, comprising:
the movable device according to claim 12.

17. A vehicle, comprising:
the distance measurement device according to claim 16.

18. A mount to which a variable deflector is able to be secured, the variable deflector including
a movable portion including a reflecting surface,
a pair of drive beams to support the movable portion rotatably around a predetermined rotation axis with the movable portion interposed between the pair of drive beams, and
a support to support the pair of drive beams,
the mount comprising a side wall member to which the support is secured, the side wall member on each of both sides of the movable portion in a direction intersecting with the rotation axis having a light passing portion in a plane along the reflecting surface in a state in which the movable portion is not rotated, the light passing portion being configured to allow light reflected by the reflecting surface to pass though the light passing portion,
wherein a wiring portion to transmit a current or voltage signal applied via an electrode connection is in a region on the movable portion other than the reflecting surface and on each of the pair of drive beams.

* * * * *